(12) United States Patent
Tsai et al.

(10) Patent No.: US 11,329,139 B2
(45) Date of Patent: May 10, 2022

(54) SEMICONDUCTOR DEVICE WITH REDUCED TRAP DEFECT AND METHOD OF FORMING THE SAME

(71) Applicant: TAIWAN SEMICONDUCTOR MANUFACTURING COMPANY LTD., Hsinchu (TW)

(72) Inventors: Chun Hsiung Tsai, Hsinchu County (TW); Kuo-Feng Yu, Hsinchu County (TW); Yu-Ming Lin, Hsinchu (TW); Clement Hsingjen Wann, Carmel, NY (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 132 days.

(21) Appl. No.: 16/514,373

(22) Filed: Jul. 17, 2019

(65) Prior Publication Data

US 2021/0020761 A1  Jan. 21, 2021

(51) Int. Cl.
*H01L 21/02* (2006.01)
*H01L 29/66* (2006.01)
(Continued)

(52) U.S. Cl.
CPC .. *H01L 29/66545* (2013.01); *H01L 21/02164* (2013.01); *H01L 21/02332* (2013.01);
(Continued)

(58) Field of Classification Search
None
See application file for complete search history.

(56) References Cited

U.S. PATENT DOCUMENTS

| 9,356,120 | B2* | 5/2016 | Wu | H01L 21/3105 |
| 2014/0264349 | A1* | 9/2014 | Sassiat | H01L 21/324 |
| | | | | 257/57 |
| 2018/0174904 | A1* | 6/2018 | Hsieh | H01L 29/785 |

FOREIGN PATENT DOCUMENTS

| TW | 201442079 A | 11/2014 |
| TW | 201640569 A | 11/2016 |

(Continued)

OTHER PUBLICATIONS

Sami Franssila Introduction to Microfabrication, Second Edition © 2010 John Wiley & Sons, L td pp. 357-366 (Year: 2010).*

(Continued)

*Primary Examiner* — Bradley Smith
(74) *Attorney, Agent, or Firm* — WPAT, P.C., Intellectual Property Attorneys; Anthony King

(57) ABSTRACT

A method of manufacturing a semiconductor device includes: providing a substrate comprising a surface; depositing a first dielectric layer and a second dielectric layer over the substrate; forming a dummy gate electrode over the second dielectric layer; forming a gate spacer surrounding the dummy gate electrode; forming lightly-doped source/drain (LDD) regions in the substrate on two sides of the gate spacer; forming source/drain regions in the respective LDD regions; removing the dummy gate electrode to form a replacement gate; forming an inter-layer dielectric (ILD) layer over the replacement gate and the source/drain regions; and performing a treatment by introducing a trap-repairing element into at least one of the gate spacer, the second dielectric layer, the surface and the LDD regions at a time before the forming of the source/drain regions or subsequent to the formation of the ILD layer.

20 Claims, 31 Drawing Sheets

(51) Int. Cl.
    *H01L 29/08*         (2006.01)
    *H01L 21/265*       (2006.01)
    *H01L 21/3105*     (2006.01)
    *H01L 21/762*       (2006.01)
    *H01L 21/266*       (2006.01)

(52) U.S. Cl.
    CPC .... *H01L 21/26513* (2013.01); *H01L 29/0847* (2013.01); *H01L 29/6659* (2013.01); *H01L 29/66553* (2013.01); *H01L 29/66795* (2013.01); *H01L 21/266* (2013.01); *H01L 21/31053* (2013.01); *H01L 21/76224* (2013.01); *H01L 29/665* (2013.01)

(56) References Cited

FOREIGN PATENT DOCUMENTS

| | | |
|---|---|---|
| TW | 201802894 A | 1/2018 |
| TW | 201822264 A | 6/2018 |
| TW | 201919113 A | 5/2019 |
| TW | 201926439 A | 7/2019 |

OTHER PUBLICATIONS https://en.wikipedia.org/wiki/High-%CE%BA_dielectric (Year: 2021).*
Office Action and Search Report dated Mar. 30, 2020 issued by Taiwan Intellectual Property Office for counterpart application No. 109100191.

* cited by examiner

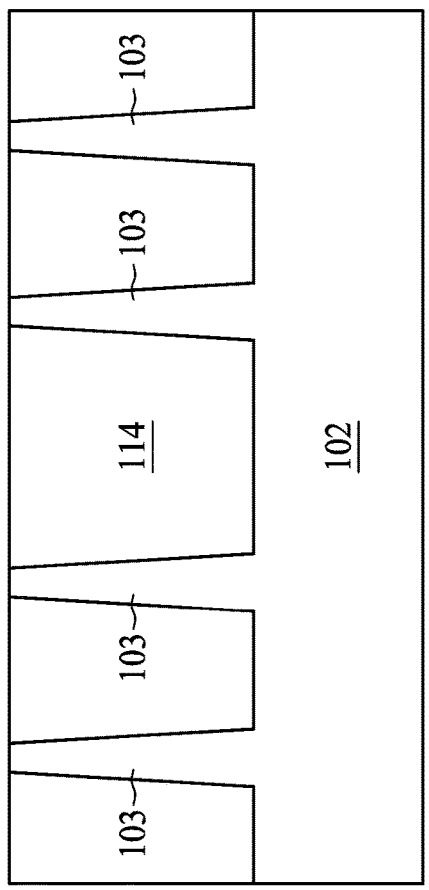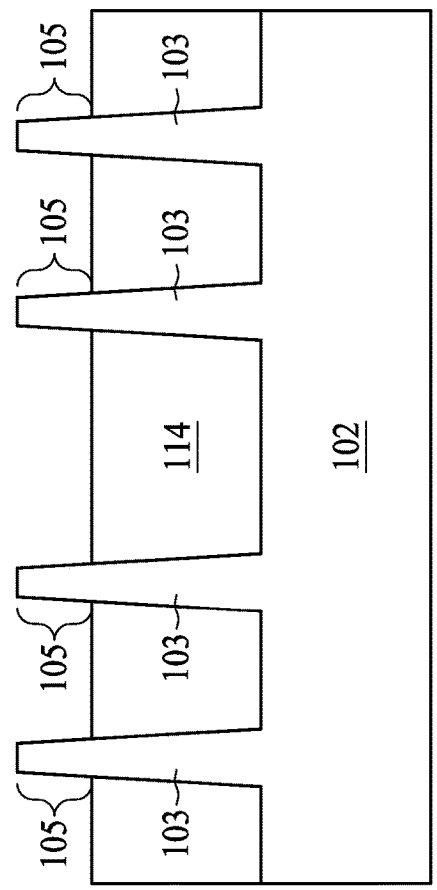

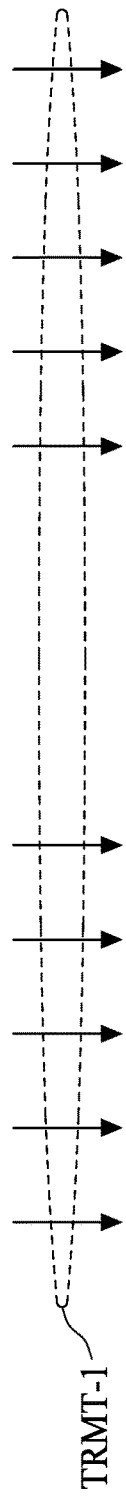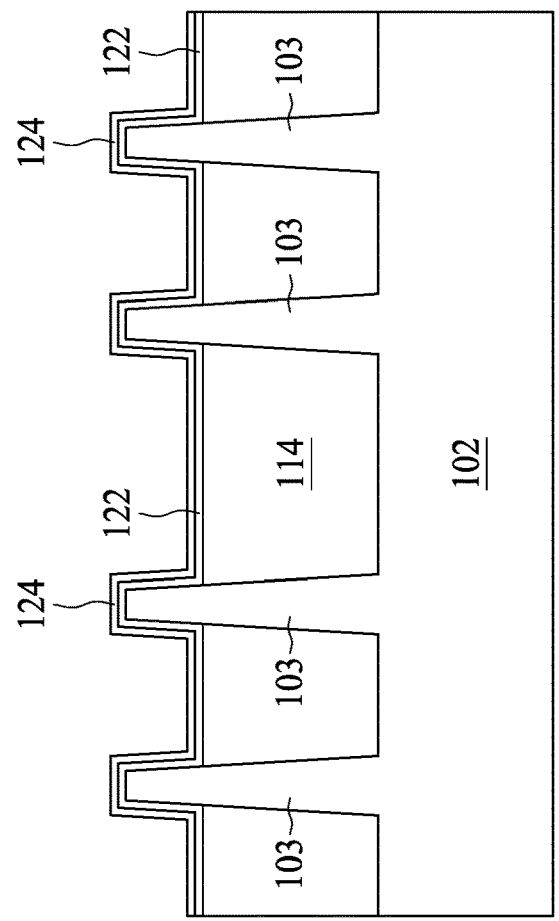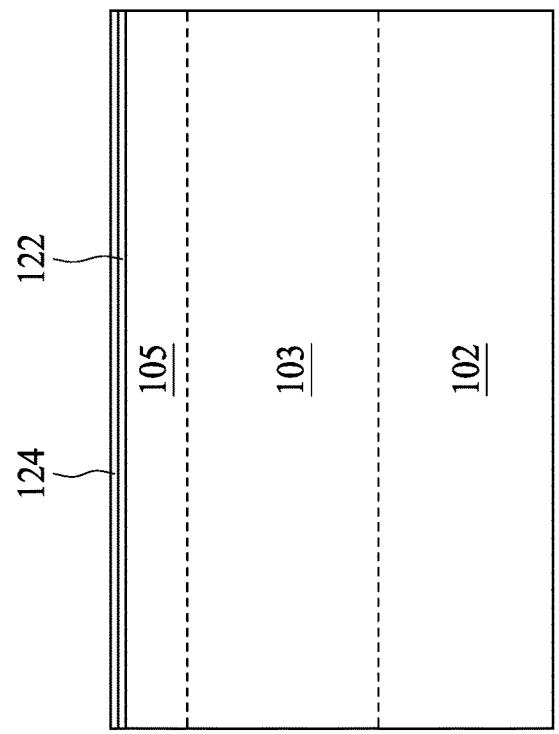
FIG. 7A
FIG. 7B

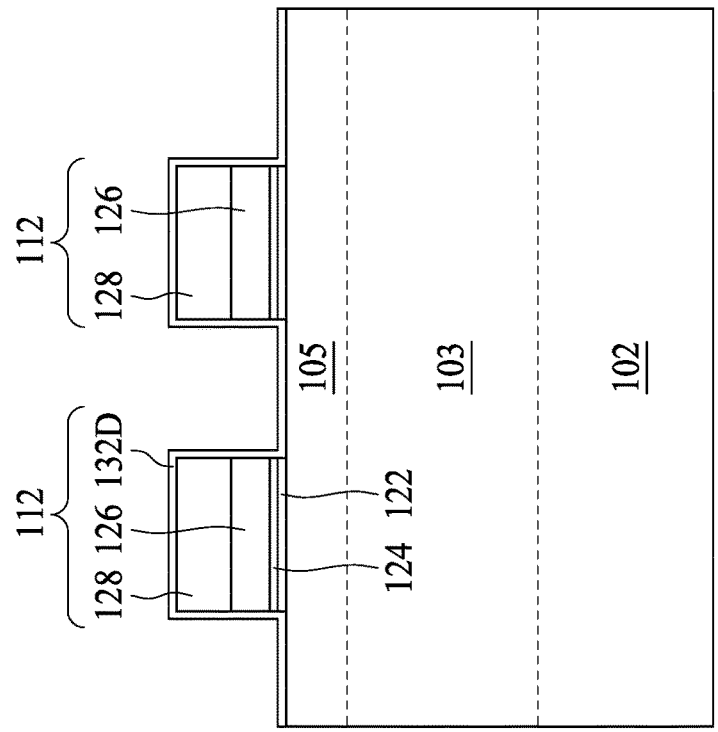
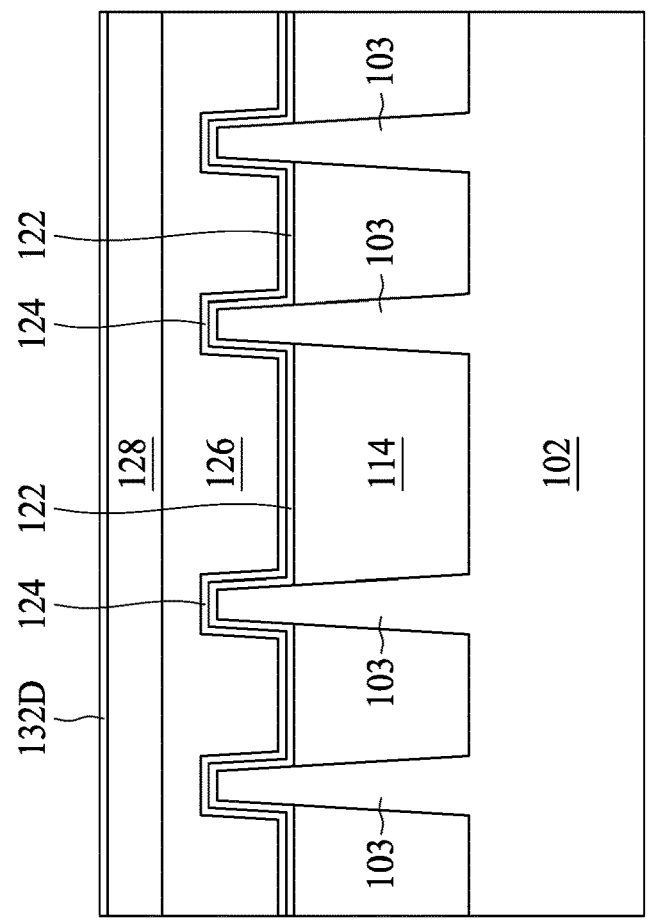
FIG. 10B
FIG. 10A

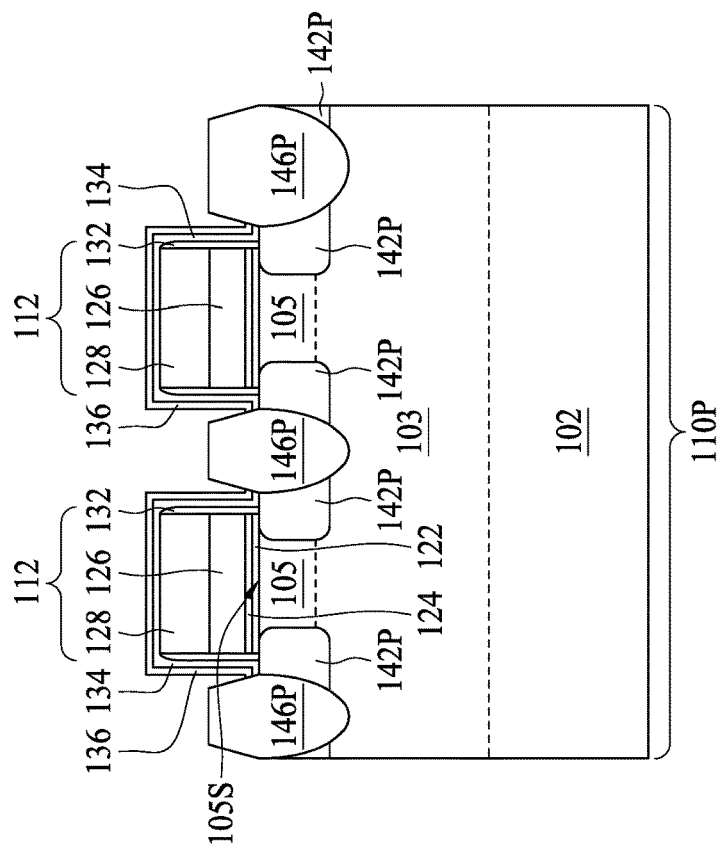
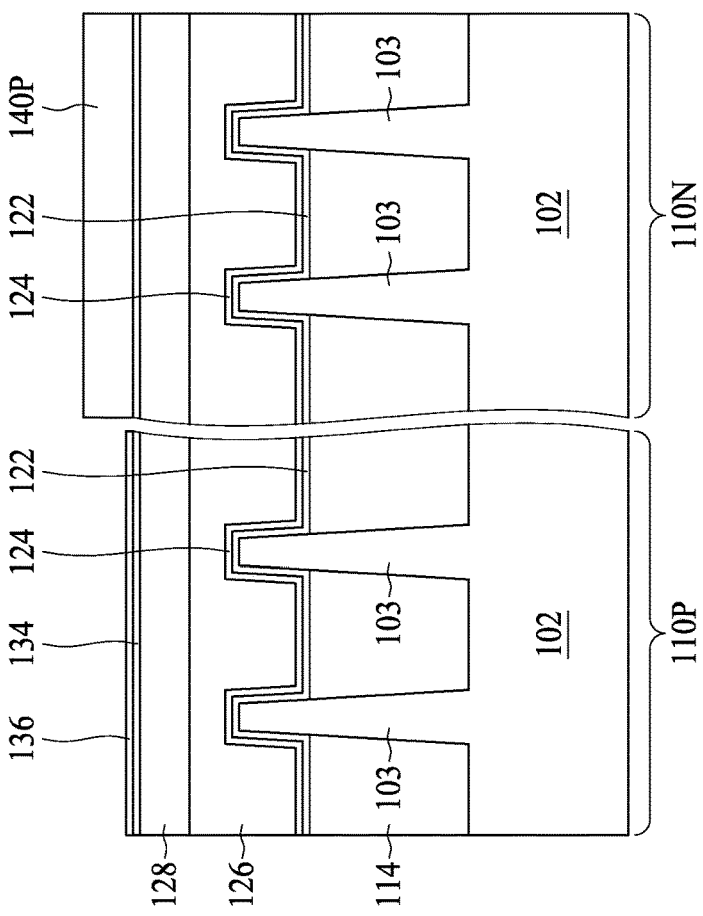
FIG. 18B
FIG. 18A

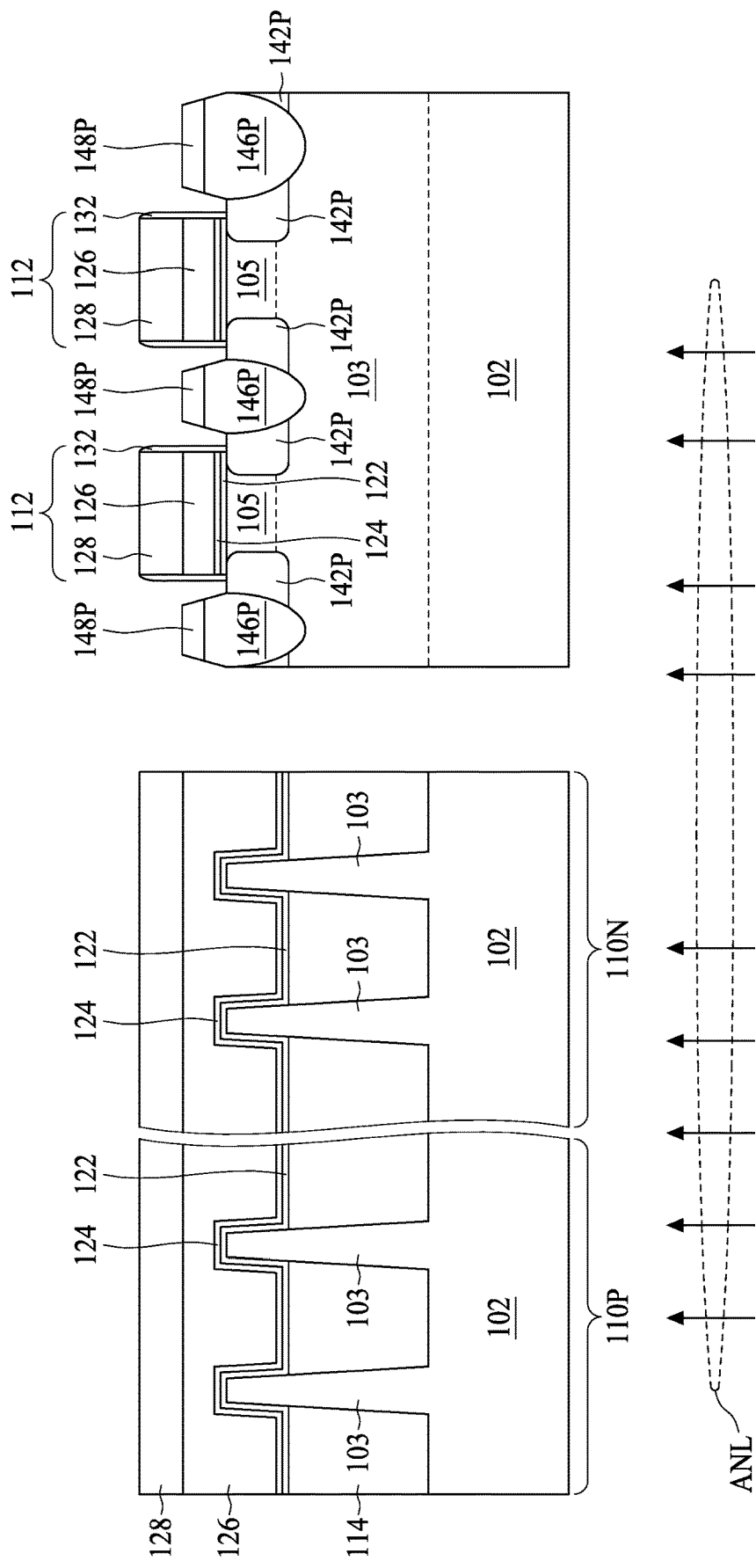

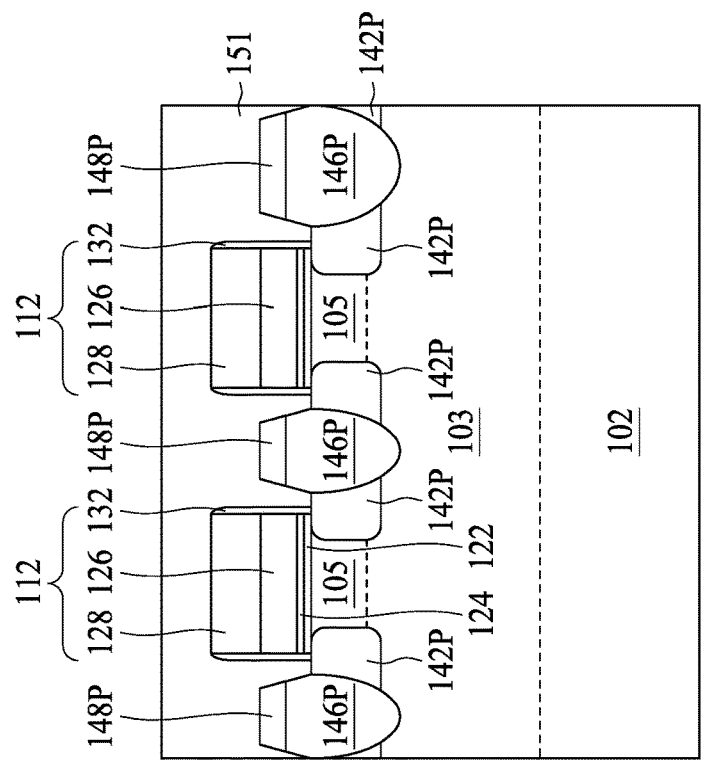
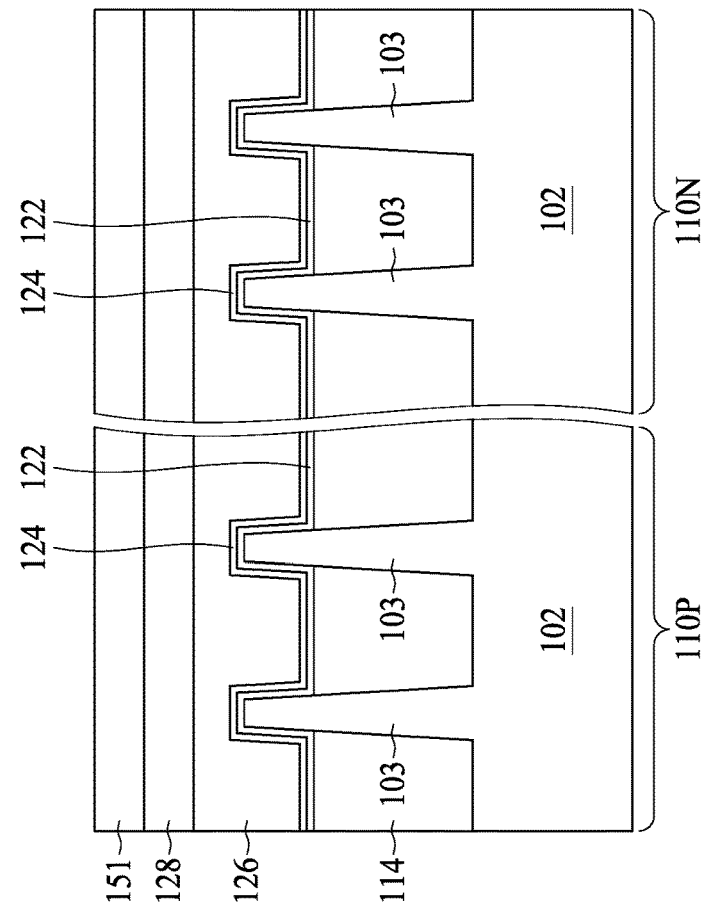
FIG. 26B
FIG. 26A

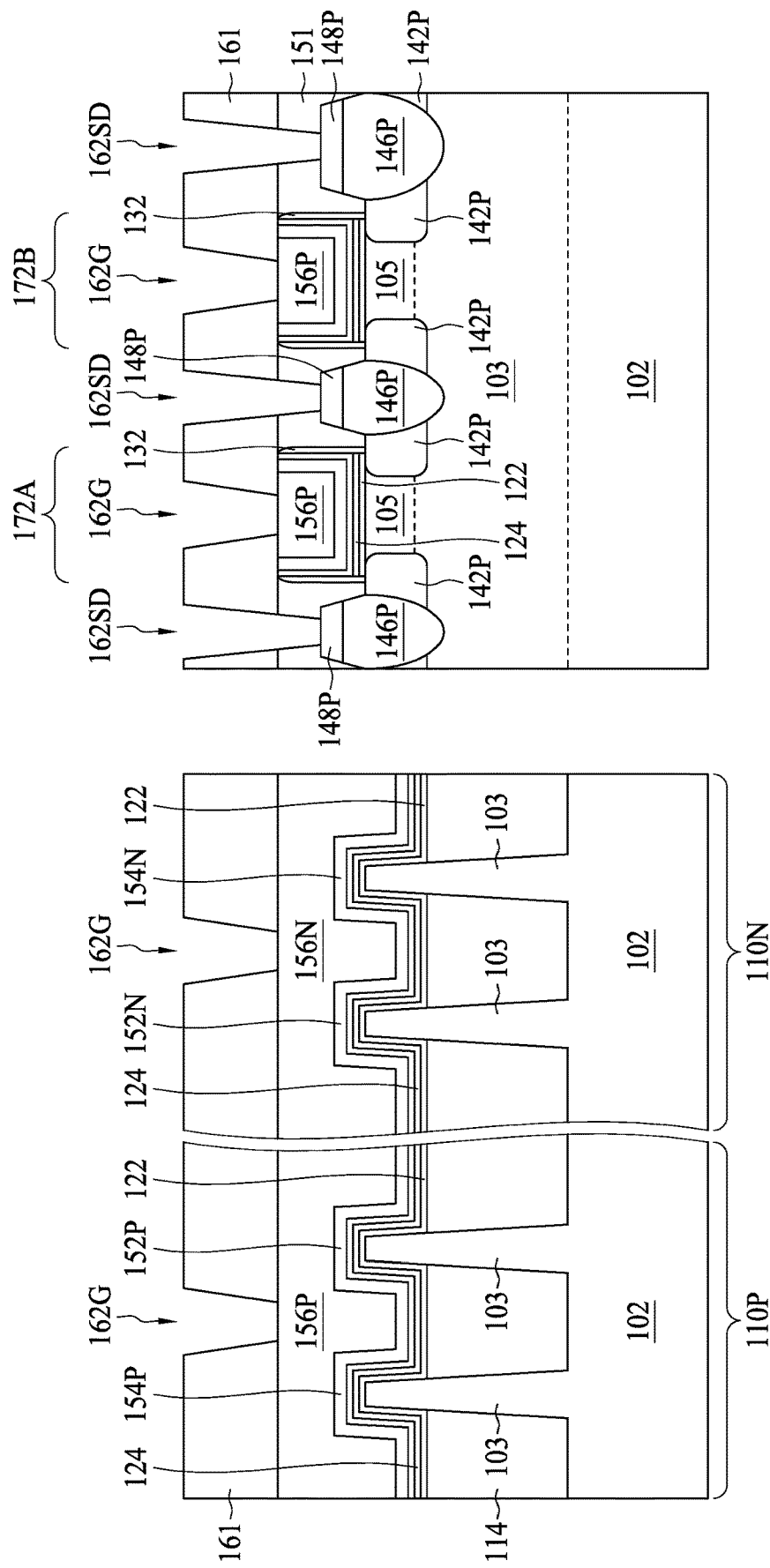

SEMICONDUCTOR DEVICE WITH REDUCED TRAP DEFECT AND METHOD OF FORMING THE SAME

BACKGROUND

As technologies evolve, design and manufacturing of semiconductor devices become more complicated in view of their smaller dimensions and more circuits providing greater functionality. Therefore, there is a continuous need to improve the methods of manufacturing the semiconductor devices in order to enhance device robustness as well as reduce cost and processing time. As the device size continues to shrink, the voltage or current level at which the device operates is getting lower. Accordingly, it is more critical to control threshold voltage stability and mitigate leakage current so as to maintain device performance.

While techniques for improving threshold voltage stability or leakage current performance have been extensively studied, they still fail to meet requirements in many aspects. Therefore, there is a need to further resolve the above-mentioned problems.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2 to 5 are cross-sectional views of intermediate stages of a method of manufacturing a semiconductor device, in accordance with some embodiments.

FIGS. 6A to 33B are cross-sectional views of intermediate stages of a method of manufacturing a semiconductor device, in accordance with some embodiments.

DETAILED DESCRIPTION

Figure 1:
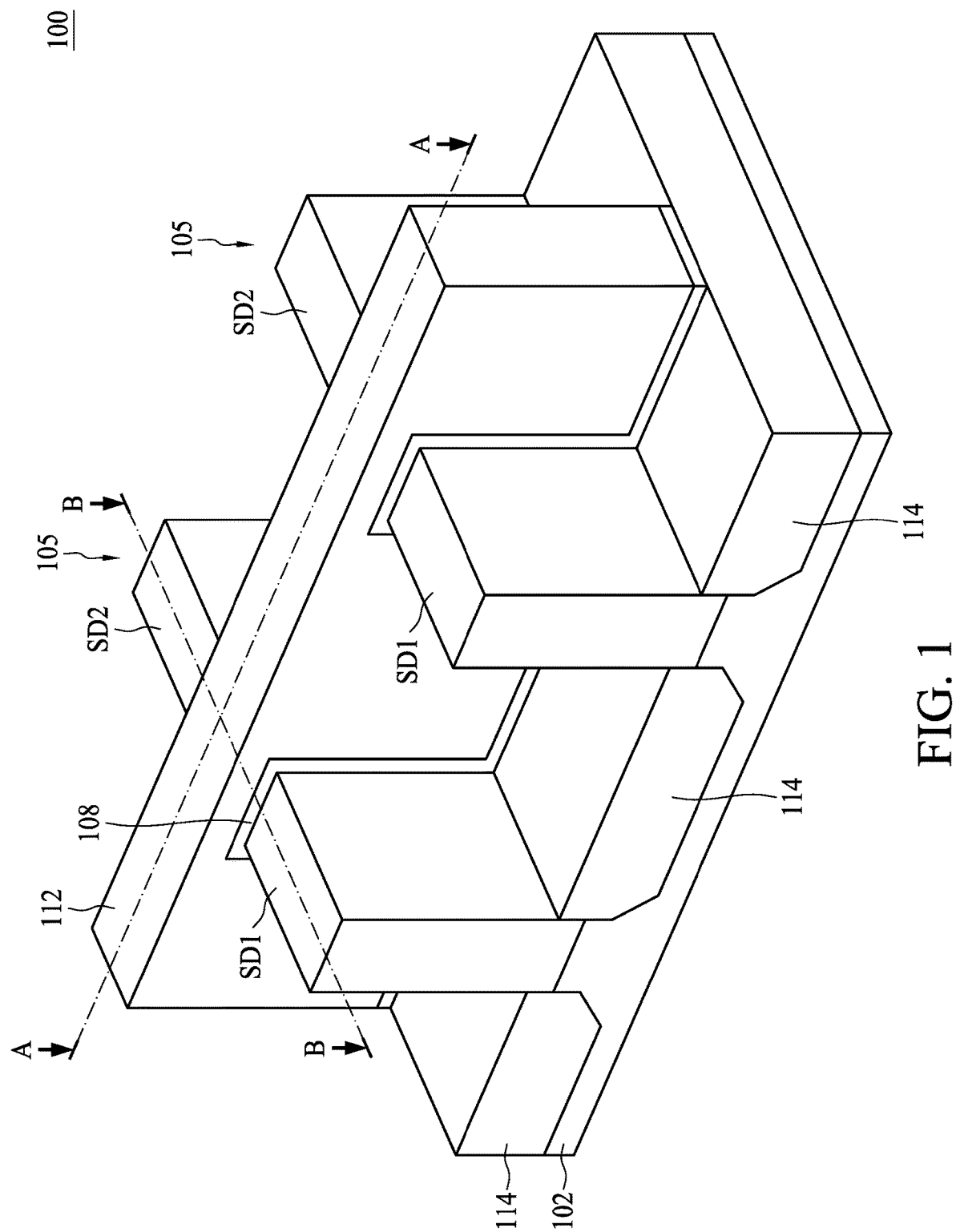
FIG. 1 is a perspective view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 70 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" and "substantially" generally mean within 10%, 5%, 1% or 0.5% of a given value or range. Alternatively, the terms "about," "substantial" and "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

A metal-oxide semiconductor (MOS) transistor is formed of a semiconductor substrate, a gate electrode and an oxide layer, wherein source/drain regions are formed in the semiconductor substrate on two sides of the gate electrode. A channel region is established close to the surface of the semiconductor substrate below the oxide layer and between the source/drain regions to conduct current under operational conditions. Charge carriers (electrons or holes) are attracted and accumulate on both sides of the oxide layer, in which the carriers in the channel region form a current between the source/drain regions when driven by an electric field. The carriers are discharged after the device is turned off. Characteristics of the carrier movement, i.e., charging and discharging around the oxide and the channel region, determine the performance, such as speed and turn-on voltage, of the MOS transistor.

One of the factors that impact the carrier movement is the presence of trap defects in the composing materials of the transistor. A trap defect is generally found in a crystal lattice (of an oxide or other semiconductor) which creates a "deep" energy well where charge carriers can become "trapped," either temporarily or permanently. The trap defect is usually generated when a layer of the MOS transistor is deposited, removed or further processed, as a lattice property of a layer or the interface between the layer and an adjacent layer is damaged. A first type of trap defect is a bulk trap existing in the bulk material; such type of defect may occur during the recrystallization process yielding polar bonds, such as a Hf—O bond in a hafnium-containing oxide material. A second type of trap defect may occur on a treated surface of silicon. The formation of trap defects in turn causes a carrier to be trapped and released randomly, degrading the stability of the electrical properties of the MOS transistor.

The present disclosure discusses a passivation scheme to mitigate the trap defect in the dielectric or silicon material of a MOS transistor. The passivation scheme can be applied to the transistor globally or locally. The passivation scheme can be performed by introducing suitable trap-repairing elements, such as nitrogen, fluorine, hydrogen and the like, to terminate the traps. The trap defects in the dielectric or silicon material can be effectively diminished and the charging/discharging characteristics of the carriers can be better controlled. The problems of threshold voltage instability, slow ramp issue of drain current and device noise can be mitigated.

Embodiments will be described with respect to a specific context, namely, a semiconductor device and a method of forming the same. Various embodiments presented herein are discussed in the context of a Fin Field-Effect Transistor (FinFET) formed using a gate-last process. In other embodiments, a gate-first process may be used. Also, the present disclosure contemplates aspects used in other types of semiconductor devices, such as planar transistor devices, multiple-gate transistor devices, 2D transistor devices, gate-all-around transistor devices, nanowire transistor devices and the like.

FIG. 1 is a perspective view of a semiconductor device 100, in accordance with some embodiments. FIG. 1 shows a FinFET device 100, however, other types of semiconductor devices are also within the contemplated scope of the present disclosure. The semiconductor device 100 includes a substrate 102, isolation regions 114, two fins 105 on the substrate 102, a gate dielectric layer 108 and a gate electrode 112. The fins 105 protrude above the substrate 102 and extend in parallel. The isolation regions 114 are formed on the substrate 102 between the adjacent fins 105. The gate dielectric layer 108 is disposed on sidewalls and over a top surface of each of the fins 105, and the gate electrode 112 is over the gate dielectric layer 108. The gate electrode 112 and the gate dielectric layer 108 extend in a direction perpendicular to the fins 105. Source/drain regions SD1 and SD2 are formed on opposite sides of each fin 105 with respect to the gate dielectric layer 108 and the gate electrode 112. A channel region (not shown) is established in the fin 105 between the source/drain regions SD1 and SD2 and is surrounded by the gate dielectric layer 108 and the gate electrode 112.

The FinFET device 100 illustrated in FIG. 1 is provided for illustrative purposes only and is not meant to limit the scope of the present disclosure. As such, other configurations, such as different numbers of fins, different numbers of gate electrodes, and a multilayer fin, are within the contemplated scope of the present disclosure. FIG. 1 further illustrates section lines that are referred to in subsequent figures. Cross section A-A is taken along a channel region, the gate dielectric layer 108, and the gate electrode 112 of the FinFET device 100. Cross section B-B is taken in a direction along a longitudinal axis of the fin 105 perpendicular to the cross section A-A. In some embodiments, cross section B-B is taken in a direction of current flow in the channel region.

FIGS. 2 to 5 are cross-sectional views of intermediate stages of a method of manufacturing the semiconductor device 100 in FIG. 1, in accordance with some embodiments. FIGS. 2 to 5 are taken along cross section A-A of FIG. 1.

Referring to FIG. 2A, a substrate 102 is provided or formed. The substrate 102 may be a semiconductor substrate, such as a bulk semiconductor, a semiconductor-on-insulator (SOI) substrate, or the like, which may be doped (e.g., with a p-type or an n-type dopant) or undoped.

Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used. In some embodiments, the semiconductor material of the substrate 102 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the substrate 102 includes integrated circuit devices formed thereon (not shown). The integrated circuit devices may include active devices, such as transistors, and passive devices, such as diodes, capacitors, resistors, inductors, or combinations thereof. The integrated circuit devices may be formed using any suitable methods known in the art.

In some embodiments, well regions (not shown) may also be formed in the substrate 102. The substrate 102 may include p-type wells (p-wells), n-type wells (n-wells), or both. In some embodiments, p-type dopants are implanted into the substrate 102 to form the p-wells. The p-type dopants may be boron, $BF_2$, or the like. In some embodiments, n-type dopants are implanted into the substrate 102 to form the n-wells. The n-type dopants may be phosphorus, arsenic, or the like. In some embodiments, an annealing operation may be performed on the substrate 102 to activate the implanted p-type and n-type dopants to improve the well performance.

Figure 2:
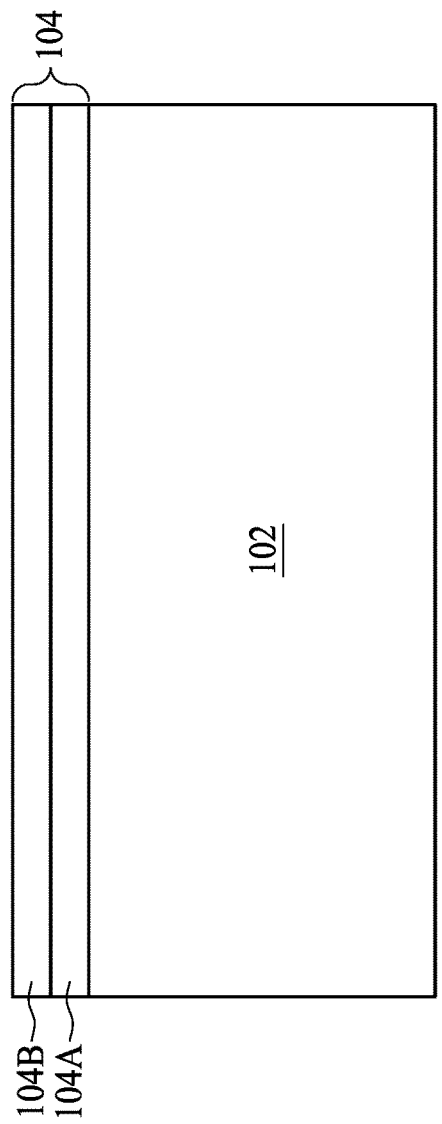

FIG. 2 further illustrates the formation of a mask 104 over the substrate 102. In some embodiments, the mask 104 serves as an etch stop layer in patterning the substrate 102. As shown in FIG. 2, in some embodiments, the mask 104 includes a first mask layer 104A and a second mask layer 104B over the first mask layer 104A. The first mask layer 104A may be a hard mask that comprises one or more layers of silicon oxide, silicon nitride, silicon oxynitride, silicon carbide, silicon carbonitride, a combination thereof, or the like, and may be formed using any suitable process, such as thermal oxidation, thermal nitridation, physical vapor deposition (PVD), chemical vapor deposition (CVD), atomic layer deposition (ALD), a combination thereof, or the like. The second mask layer 104B may comprise a photoresist used to pattern the first mask layer 104A. The second mask layer 104B may be formed using a spin-on coating or deposition process and may be patterned using suitable photolithography techniques. In some embodiments, the mask 104 may comprise three or more mask layers.

Figure 3:
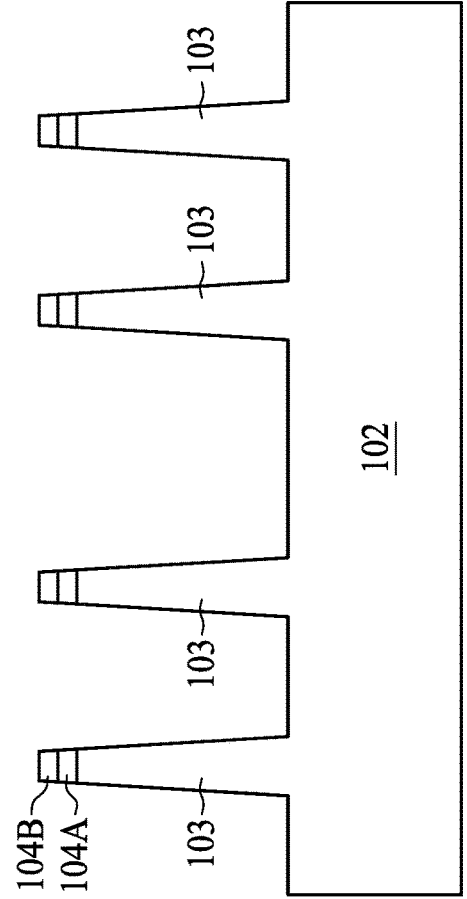

FIG. 3 shows the formation of semiconductor strips 103 from the substrate 102. Initially, the mask layers 104A and 104B may be patterned using suitable photolithography and etching operations, wherein openings are formed in the mask 104 and expose portions of the substrate 102. Next, an etch process is performed to etch the substrate 102 using the patterned mask 104 as mask. As a result, the patterns of the mask 104 are transferred to the substrate 102 to form the semiconductor strips 103. The etch operation may comprise any suitable etch process, such as a wet etch, a dry etch, a reactive ion etch (RIE), neutral beam etch (NBE), or the like. In some embodiments, the etch process is an anisotropic etch. In some embodiments, after the forming of the semiconductor strips 103, remaining portions of the mask 104 may be removed by any suitable process. In other embodiments, portions of the mask 104, such as the first mask layer 104A, may remain over the semiconductor strips 103.

Referring to FIG. 4, isolation regions 114 are formed in trenches between neighboring semiconductor strips 103. The isolation regions 114 may include insulating materials, such as a dielectric material, e.g., silicon oxide, silicon nitride, silicon oxynitride, a combination thereof, or the like. The isolation regions 114 may be formed by a high-density plasma chemical vapor deposition (HDP-CVD), flowable CVD (FCVD), ALD, PVD, a combination thereof, or the like. Other insulation materials formed by any suitable process may be also used. In some embodiments, an annealing process may be performed after the insulation material of the isolation regions 114 is deposited.

In some embodiments, the isolation regions 114 may include a liner (not shown) formed on sidewalls and upper surfaces of the substrate 102 and the semiconductor strips 103 prior to the forming of the isolation regions 114. In some embodiments, the liner may comprise silicon nitride, silicon oxide, silicon oxynitride, polymer, combinations thereof, or the like. The formation of the liner may include any suitable method, such as ALD, CVD, HDP-CVD, a combination thereof, or the like. In such embodiments, the liner may prevent (or at least reduce) diffusion from the semiconductor strips 103 into the isolation regions 114 during the annealing of the isolation regions 114.

In some embodiments, a planarization operation, such as mechanical grinding or chemical mechanical polishing (CMP), may be performed to remove excess portions of the isolation regions 114, such that top surfaces of the isolation regions 114 and top surfaces of the semiconductor strips 103 are coplanar. In some embodiments where portions of the mask 104 remain on the semiconductor strips 103 after the forming of the semiconductor strips 103, the planarization process may also include removing the remaining portions of the mask 104.

Referring to FIG. 5, the isolation regions 114 are recessed below the semiconductor strips 103. In some embodiments, the recessed isolation regions 114 are referred to as shallow trench isolation (STI) regions. The isolation regions 114 are recessed such that upper portions of the semiconductor strips 103, referred to as fins 105 herein, protrude from between neighboring isolation regions 114. In some embodiments, top surfaces of the isolation regions 114 may include a flat, convex, or concave surface. The isolation regions 114 may be recessed using a wet etch, a dry etch, or a combination thereof.

FIGS. 6A to 33B are cross-sectional views of intermediate stages of a method of manufacturing the semiconductor device 100, in accordance with some embodiments. In some embodiments, the intermediate stages of the method shown in FIGS. 6A to 33B are provided following the step illustrated in FIG. 5. Figure numbers ending with an "A" are illustrated along the reference cross section A-A in FIG. 1; figure numbers ending with a "B" are illustrated along the reference cross section B-B illustrated in FIG. 1. It should be understood that additional operations can be provided before, during, and after processes shown in FIGS. 6A to 33B, and some of the operations described below can be replaced or eliminated for additional embodiments of the method. The order of the operations and processes may be interchangeable. Further, the same or similar configuration, structure, materials, operations or processes of one embodiment may be employed in other embodiments, and the detailed explanation thereof may be omitted.

Figure 6B:
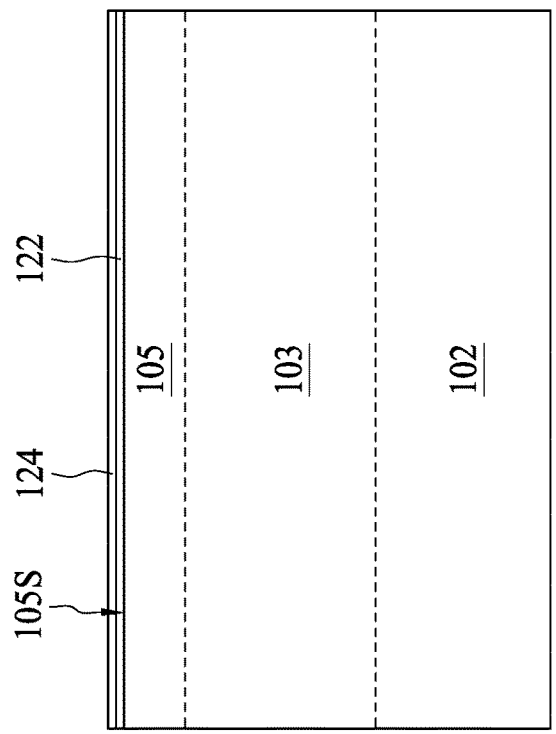
Figure 6A:
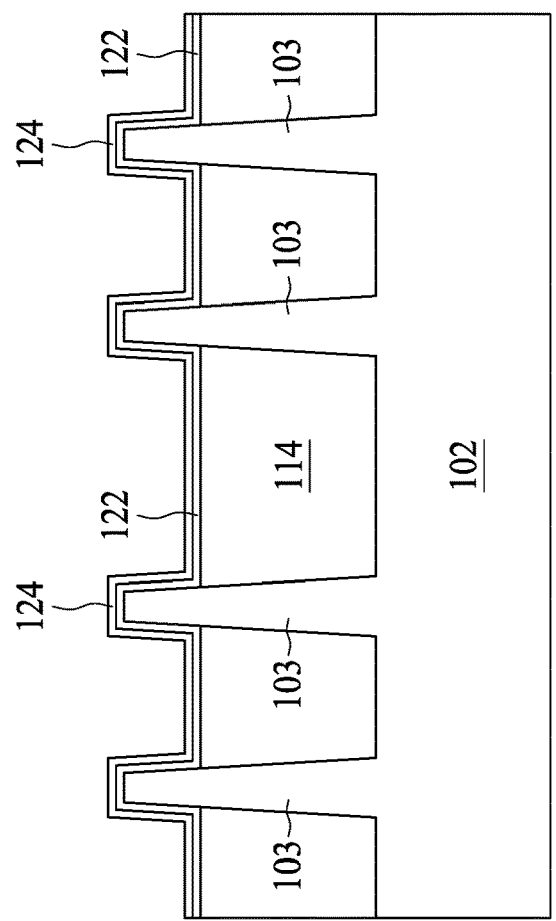

Referring to FIGS. 6A and 6B, a first dielectric layer 122 is formed on sidewalls and an upper surface 105S of each of the fins 105. In some embodiments, the first dielectric layer 122 may be also formed over the isolation regions 114. The first dielectric layer 122 may comprise an oxide, such as silicon oxide, or the like. Other dielectric materials may also be possible, such as nitride, carbide, oxynitride, and the like. In some embodiments, the first dielectric layer 122 includes a low dielectric constant (low-k) material, such as a material having a dielectric constant less than about 4.0. The first dielectric layer 122 may be formed using ALD, CVD, or PVD, may be thermally grown, or may be formed using other suitable processes.

Subsequently, a second dielectric layer 124 is formed over the first dielectric layer 122. In some embodiments, the second dielectric layer 124 may be also formed over the isolation regions 114. The second dielectric layer 124 may be different from the first dielectric layer 122 and may comprise a high dielectric constant (high-k) material having a dielectric constant greater than about 4.0. The dielectric material of the second dielectric layer 124 may comprise metal oxides, metal nitrides, metal silicates, transition metal oxides, transition metal nitrides, transition metal silicates, oxynitrides of metals, metal aluminates, zirconium silicate, zirconium aluminate, or the like. In some embodiments, the second dielectric layer 124 may be formed of $Al_2O_3$, $HfO_2$, $ZrO_2$, $HfO_xN_y$, $ZrO_xN_y$, $HfSi_xO_y$, $ZrSi_xPO_y$, $HfSi_xO_yN_z$, $ZrSi_xO_yN_z$, $TiO_2$, $Ta_2O_5$, $La_2O_3$, $CeO_2$, $Bi_4Si_2O_{12}$, $WO_3$, $Y_2O_3$, $LaAlO_3$, $Ba_{1-x}Sr_xTiO_3$, $PbTiO_3$, $BaTiO_3$ (BTO), $SrTiO_3$ (STO), $BaSrTiO_3$ (BST), $PbZrO_3$, lead-strontium-titanate (PST), lead-zinc-niobate (PZN), lead-zirconate-titanate (PZT), lead-magnesium-niobium (PMN), yttria-stabilized zirconia (YSZ), ZnO/Ag/ZnO (ZAZ), a combination thereof, or the like. The second dielectric layer 124 may be formed using ALD, CVD, PVD, Molecular-Beam Deposition (MBD), or other suitable processes.

Subsequently, a first treatment TRMT-1 is performed on the second dielectric layer 124 as shown in FIGS. 7A and 7B. The first treatment TRMT-1 is configured to mitigate or at least reduce trap defects that occur during the formation of the first dielectric layer 122 and the second dielectric layer 124. The first treatment TRMT-1 may introduce nitrogen as trap-repairing element into the trap defects in the high-k materials of the second dielectric layer 124 through, for example, a nitridation process. In some embodiments, the nitridation process is performed using nitrogen-containing species, such as $N_2$ or $NH_3$. In some embodiments, the nitridation process may increase the density of the second dielectric layer 124 to prevent it from being damaged in a subsequent process.

In some embodiments, the nitridation process provides $N_2$ plasma by a Decoupled Plasma Nitridation (DPN) process. For example, the second dielectric layer 124 is nitrided by thermal nitridation with nitrogen plasma at a temperature between about 100° C. and about 500° C., a pressure between 1 mtorr and 100 mtorr, and a power between about 100 Watts and about 1000 Watts for a period between about 10 and about 300 seconds. In some embodiments, the nitridation adopts a nitrogen-containing gas, such as pure ammonia or $N_2$, with a flow rate between about 10 sccm and about 300 sccm. In some embodiments, the nitridation causes a nitrogen concentration in the second dielectric layer 124 between about 1% and about 10% or between about 5% and about 6%. The nitrogen-containing second dielectric layer 124 containing a nitrogen concentration less than about 1% may not render a passivation performance as desired, while a nitrogen concentration greater than about 10% may increase the possibility of adverse effects, such as the negative-bias temperature instability (NBTI) effect. In some embodiments, the controlled nitrogen concentration is achieved by limiting the nitrogen-containing gas between about 10 sccm and about 300 sccm. In some embodiments, no RF bias is introduced during the DPN process.

Another nitridation process may also be incorporated in the first treatment TRMT-1. For example, a post-nitridation anneal (PNA) process is alternatively or additionally performed with respect to the DPN process. In some embodiments, the PNA process is performed at a temperature higher than that used in DPN, such as between about 400° C. and about 850° C. In some embodiments, the PNA process is performed using a nitrogen-containing gas as an anneal gas for a period between about 1 second and about 180 seconds. In some embodiments, the PNA process adopts a nitrogen-containing gas, such as pure $N_2$, with a flow rate between about 10 sccm and about 200 sccm. In some embodiments, the PNA process causes a nitrogen concentration in the second dielectric layer 124 between about 1% and about 10% or between about 5% and about 6%. The PNA process may cause the second dielectric layer 124 to react with nitrogen to reach a stable state, and may drive the nitrogen deeper to create a more uniform second dielectric layer 124.

Figure 8B:
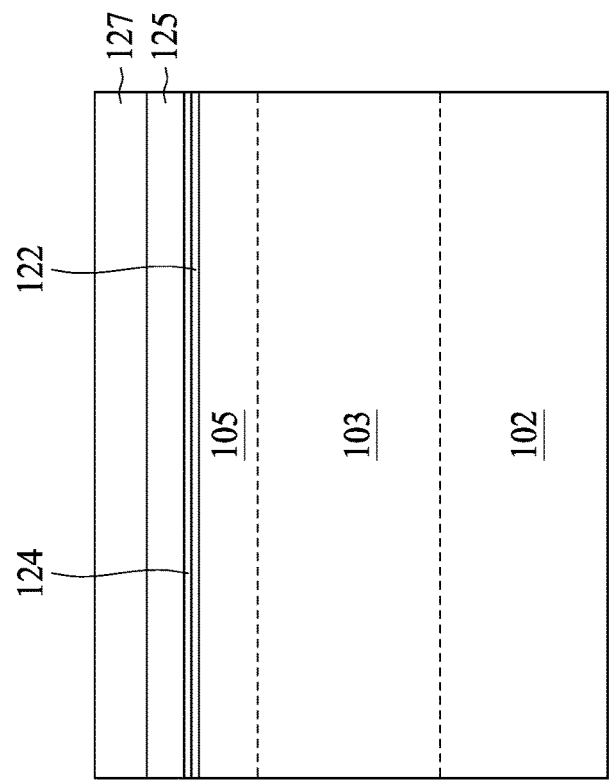
Figure 8A:
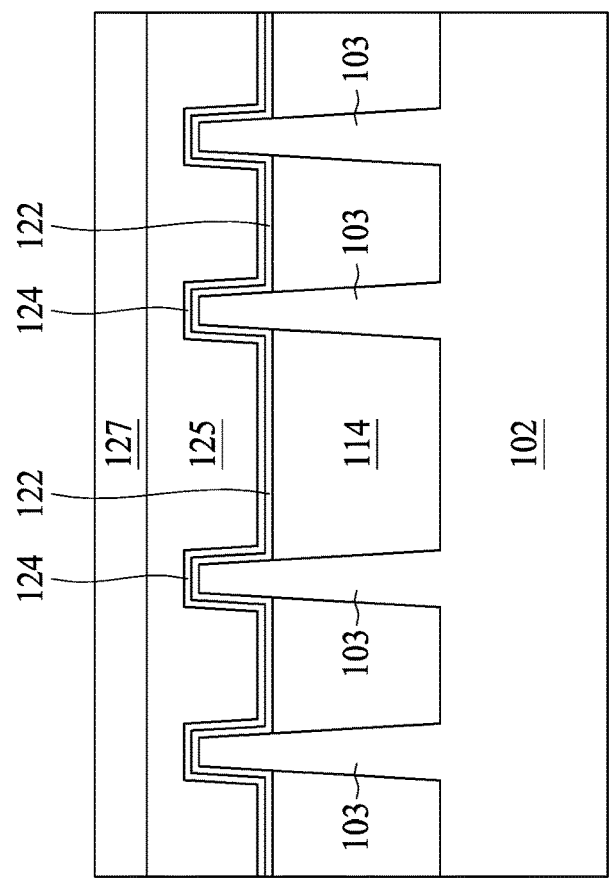

Subsequently, as illustrated in FIGS. 8A and 8B, a gate electrode layer 125 and a mask layer 127 are sequentially formed over the second dielectric layer 124. In some embodiments, a material of the gate electrode layer 125 is deposited over the second dielectric layer 124 and then planarized using, for example, a CMP process. The gate electrode layer 125 may include polysilicon, although other conductive materials, such as metal, may also be used. The mask layer 127 may include one or more layers of, for example, silicon oxide, silicon nitride, silicon oxynitride, silicon carbide, silicon carbonitride, a combination thereof, or the like, and may be formed using any suitable process, such as thermal oxidation, thermal nitridation, ALD, PVD, CVD, a combination thereof, or the like.

Figure 9B:
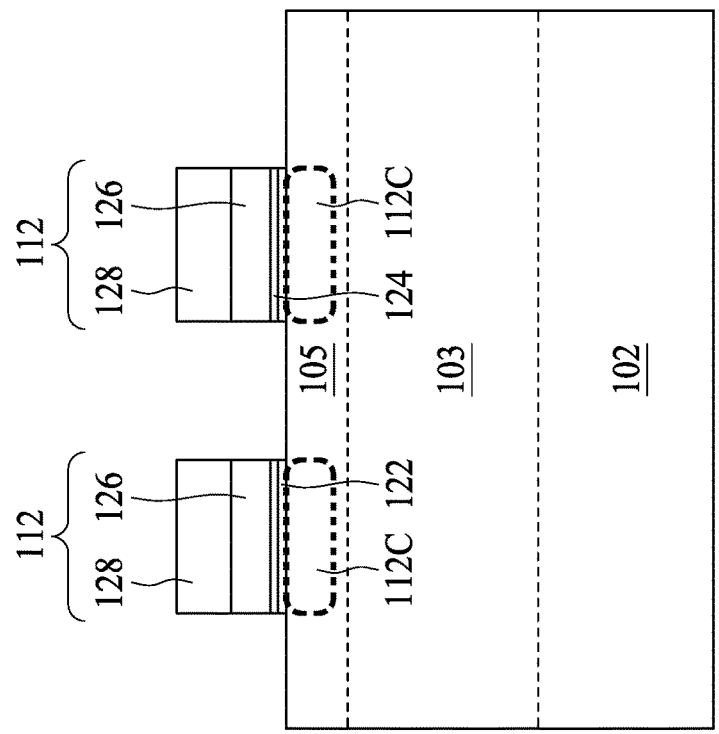
Figure 9A:
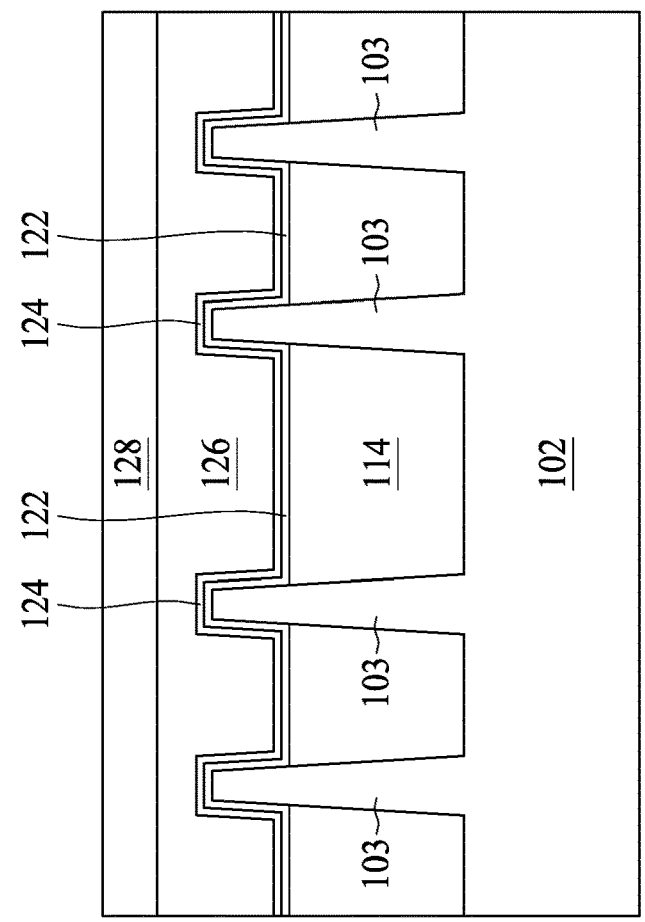

Referring to FIGS. 9A and 9B, the mask layer 127 is patterned using suitable photolithography and etching techniques to form a patterned mask layer 128. The pattern of the patterned mask layer 128 is transferred to the gate electrode layer 125, the second dielectric layer 124 and the first dielectric layer 122 by suitable etching techniques to form gates electrodes 112 straddling the fins 105 (illustrated in FIG. 1). The gates electrodes 112 may also have a lengthwise direction substantially perpendicular to the lengthwise direction of respective fins 105. The gate electrode layer 125 is thus patterned into a gate electrode 126, also referred to as a dummy gate electrode 126. Channel regions 112C are to be formed in respective fins 105. The pattern of the gates electrodes 112 covers respective channel regions 112C of the fins 105 while exposing source/drain regions SD1 and SD2 of the fins 105 (illustrated in FIG. 1). In some embodiments, the gates electrodes 112 in an input/output region may have a larger size and a larger pitch than those in a logic region. As described below, the gates electrodes 112 serve as dummy gate electrodes or sacrificial gate electrodes and are subsequently replaced by replacement gates. In other embodiments, portions of the dummy gate electrodes 112, such as the dielectric layers 122 and 124, are not replaced during forming of the replacement gates and remain in the final structure of the semiconductor device 100.

FIGS. 10A and 10B illustrate the formation of a dielectric layer 132D over the gates electrodes 112, the isolation regions 114 and the fins 105. The dielectric layer 132D may be conformally deposited along sidewalls and upper surfaces of the gates electrodes 112. In some embodiments, the dielectric layer 132D may comprise silicon nitride (SiN), silicon oxynitride (SiON), silicon oxycarbide (SiOC), silicon carbonitride (SiCN), silicon carboxynitride (SiOCN), a combination thereof, or the like, and may be formed using PVD, CVD, ALD, a combination thereof, or the like. In some embodiments, the dielectric layer 132 has a thickness between about 2 nm and about 5 nm.

Figure 11B:
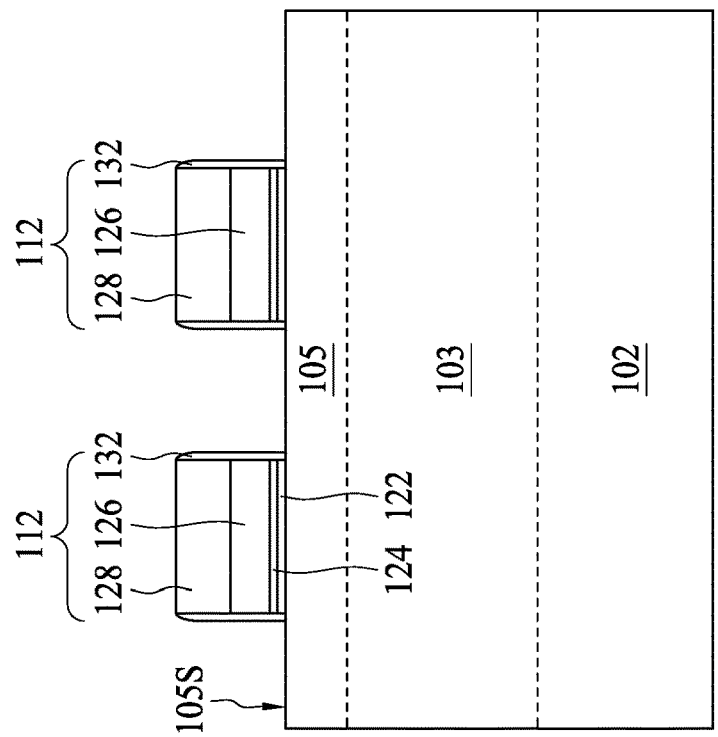
Figure 11A:
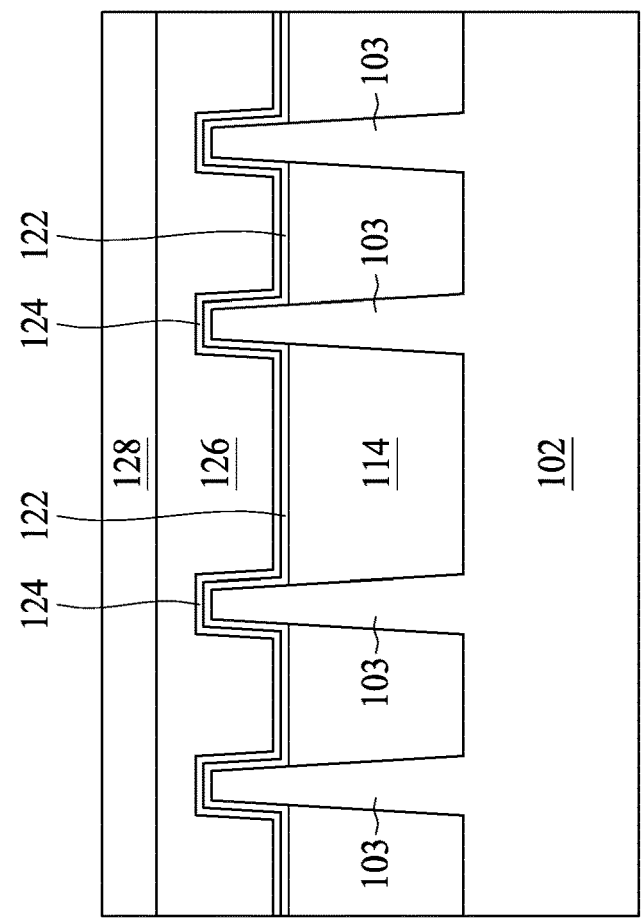

Referring to FIGS. 11A and 11B, the dielectric layer 132D is etched to form a gate spacer 132 along sidewalls of the gates electrodes 112. Horizontal portions of the dielectric layer 132D on the gates electrodes 112, the isolation regions 114 and the surface 105S of the fins 105 are removed by the etch. The etch may be anisotropic, such as a dry etch or an RIE process using a directional ion bombardment to selectively etch the horizontal portions of the dielectric layer 132D while keeping the vertical portions substantially intact. However, such bombardment may further damage the surface 105S of the fin 105 that is used as part of a channel region or source/drain regions of the semiconductor device 100. Dangling bonds may be left in the lattice structure due to the bombardment, e.g., around the surface 105S of the fins 105, and may need to be passivated.

Figure 12B:
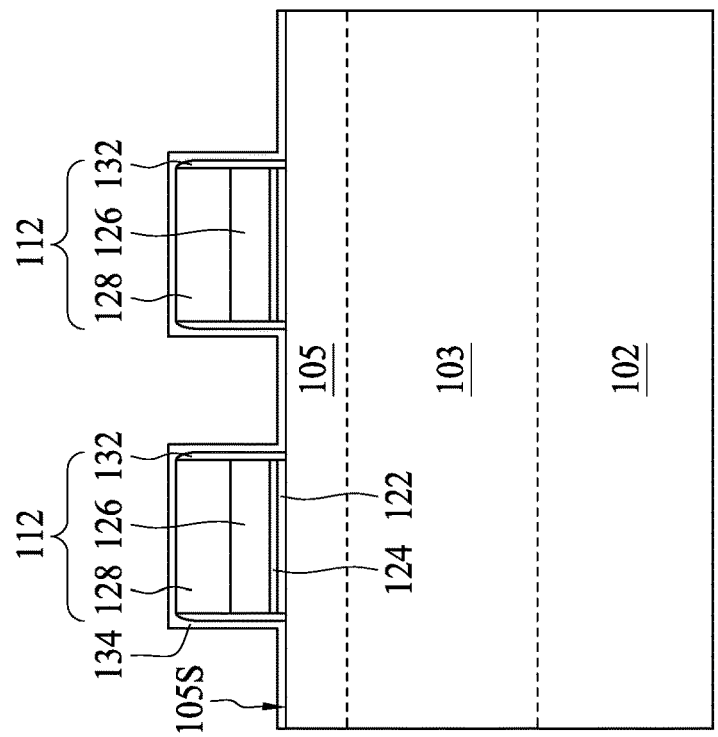
Figure 12A:
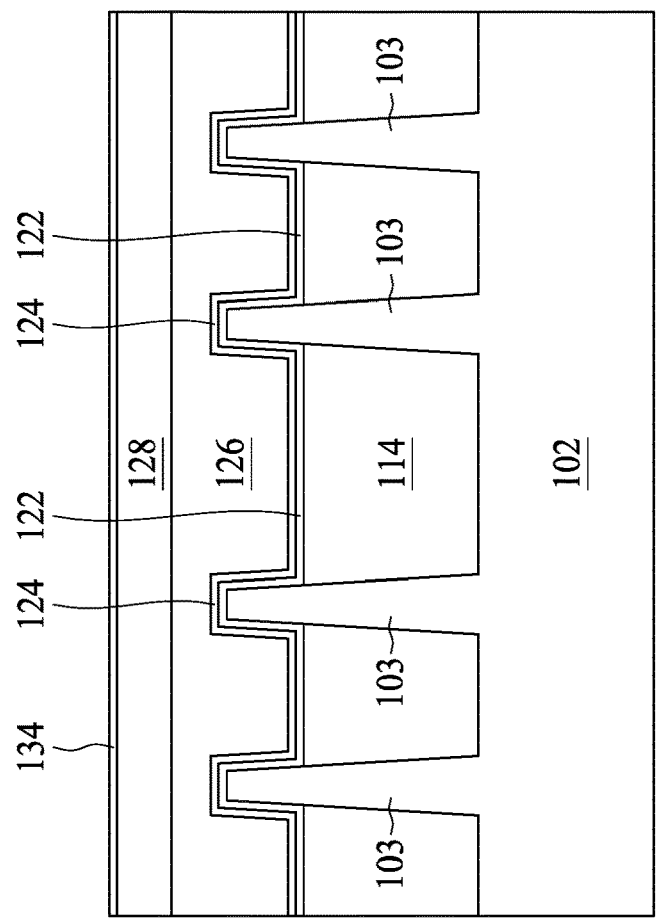

FIGS. 12A and 12B illustrate the formation of another dielectric layer 134 over the gate electrodes 112, the gate spacer 132 and the fins 105. The dielectric layer 134 may be conformally deposited along sidewalls and upper surfaces of the gates electrodes 112 and laterally surrounds the gate spacer 132. In some embodiments, the gate spacer 132 may comprise silicon nitride (SiN), silicon oxynitride (SiON), silicon oxycarbide (SiOC), silicon carbonitride (SiCN), silicon carboxynitride (SiOCN), a combination thereof, or the like, and may be formed using CVD, ALD, a combination thereof, or the like. In the depicted embodiment, the dielectric layers 132D and 134 are formed of different materials, e.g., silicon nitride and silicon oxide, respectively. In some embodiments, the dielectric layer 134 has a thickness between about 2 nm and about 4 nm.

During the formation of the dielectric layer 134, the property of the surface 105S of the fins 105 is modified by deposition of the material of the dielectric layer 134. Due to different material compositions of the fins 105 and the dielectric layer 134, the surface 105S may be altered, i.e., with more dangling bonds occurring around the surface 105S. In additional to the passivation scheme of the first treatment TRMT-1 shown in FIGS. 7A and 7B, the present disclosure further provides methods aiming at reducing the dangling bonds formed by the operations shown in FIGS. 11A and 12A, and FIGS. 11B and 12B, and improving the performance of the semiconductor device 100.

Figure 13A:
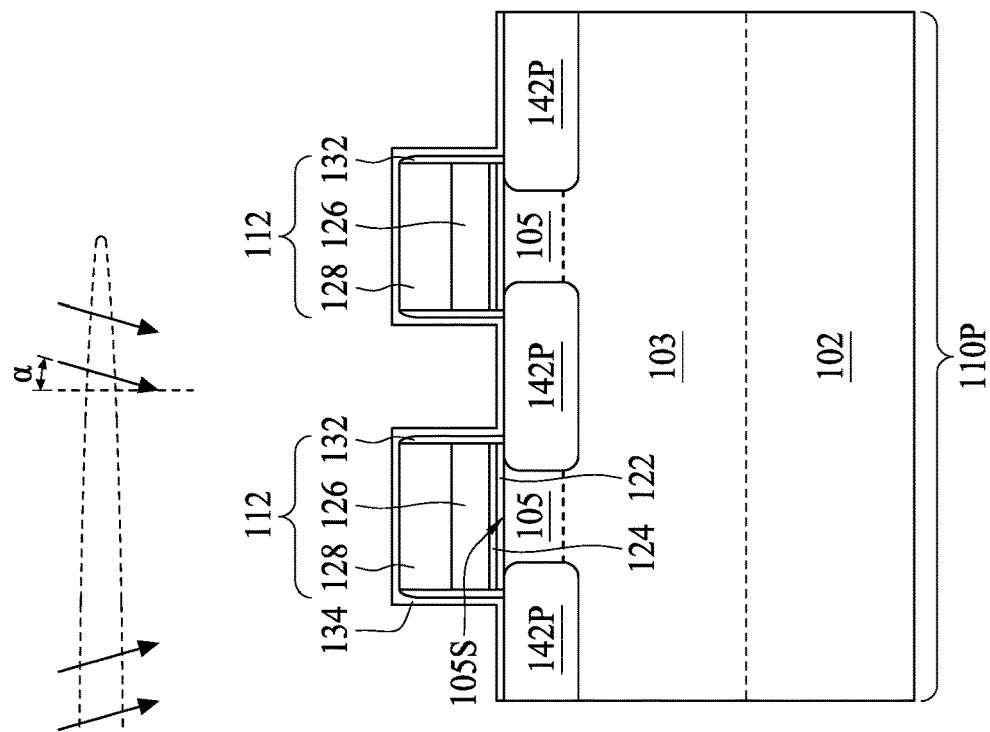
Figure 13B:
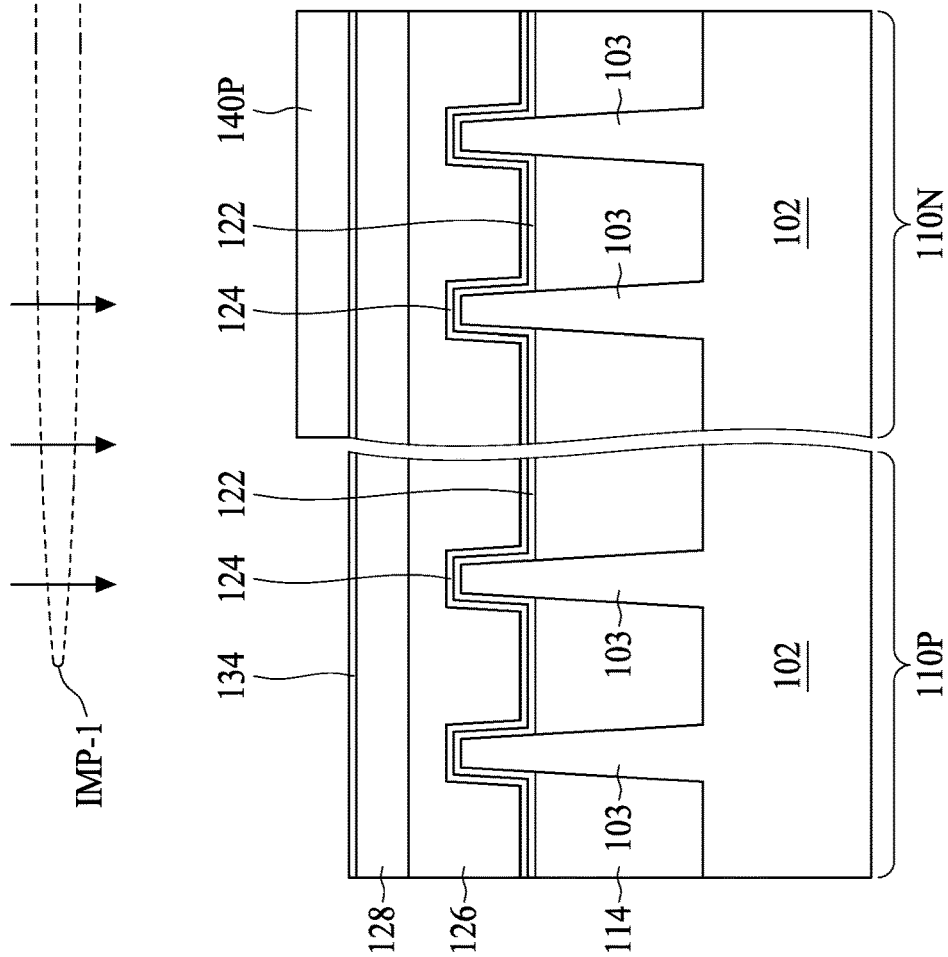

Referring to FIGS. 13A and 13B, an ion implantation procedure IMP-1 is performed to form lightly-doped source/drain (LDD) regions of the semiconductor device 100. FIG. 13A illustrates that the substrate 102 includes a p-type zone 110P including p-type transistors and an n-type zone 110N including n-type transistors. In some embodiments, a photoresist 140P is deposited to mask the n-type zone 110N during implanting of the p-type zone 110P. FIG. 11B illustrates the cross section along a fin 105 in the p-type zone 110P. P-type dopants, such as boron or $BF_2$, are implanted during the ion implantation procedure IMP-1 into the fins 105 to form p-type LDD regions 142P between the adjacent gate electrodes 112. During the implantation procedure IMP-1, the gate electrodes 112 may act as a mask to prevent (or at least reduce) dopants from being implanted into the channel regions of the fins 105.

In some embodiments, the implantation procedure IMP-1 is performed at a power greater than 0.5 KeV, such as between 0.5 KeV and about 2 KeV, and at a dose between about 1E14 atoms/cm$^2$ and about 2E15 atoms/cm$^2$. In some embodiments, the implantation procedure IMP-1 is performed with a tilted angle α, e.g., between 0° and 20°, to drive the dopants to extend below the gate corner of the dummy gate electrodes 112. After the implantation process, an annealing process may be performed to activate the implanted dopants. The annealing process may be performed by a rapid thermal annealing (RTA) at a temperature between about 800° C. and about 1000° C., such as 950° C.

Figures 14A, 14B:
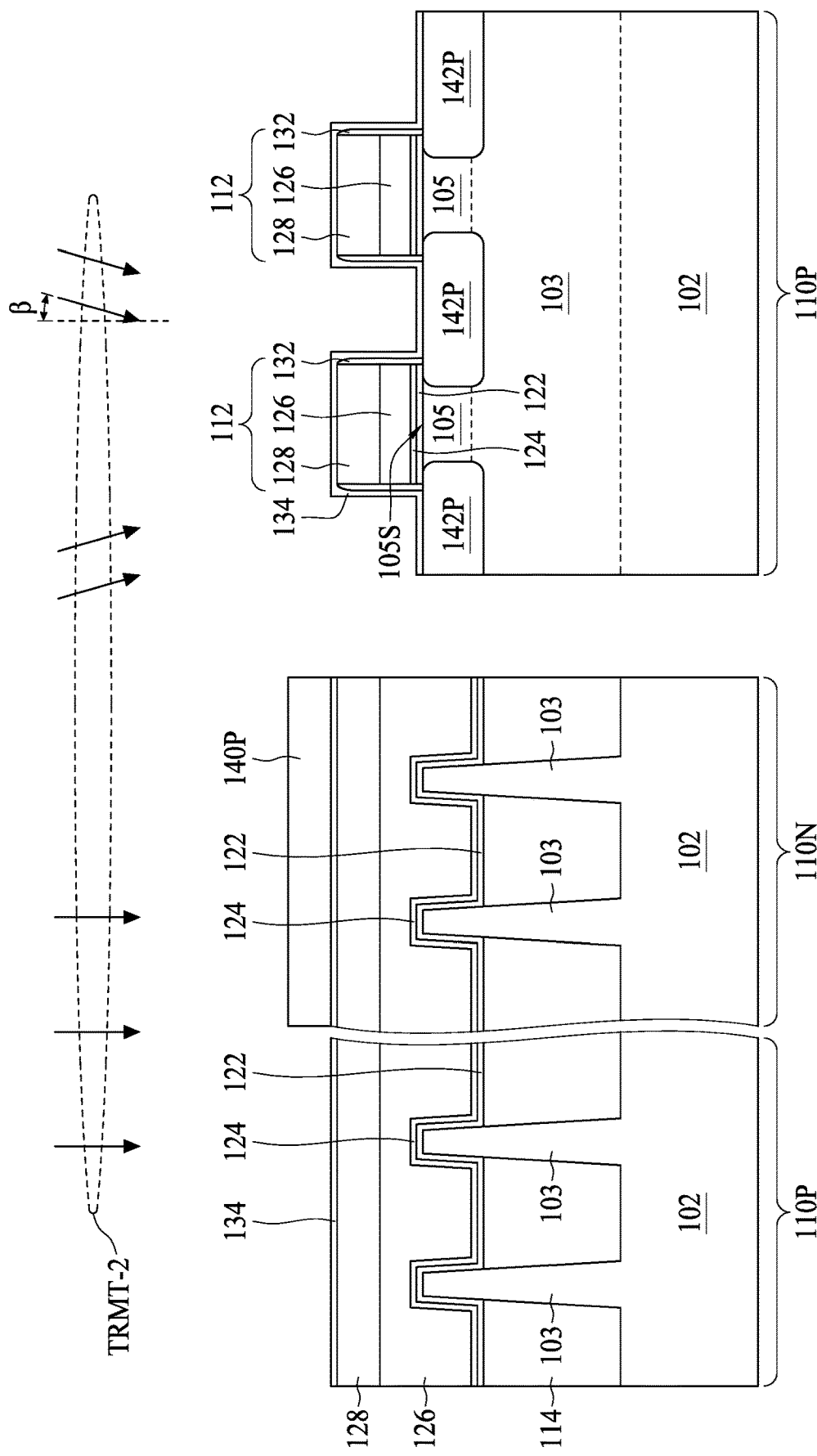

FIGS. 14A and 14B show a second treatment TRMT-2. The second treatment TRMT-2 may include an ion implantation procedure to introduce a trap-repairing element to the surface 105S of the fins 105 or the damaged dielectric layer, e.g., the gate spacer 132 and the dielectric layer 134. In some embodiments, the second treatment TRMT-2 is performed concurrently with the ion implantation procedure IMP-1. The passivating element supplied by the second treatment TRMT-2 to the p-type LDD regions 142P may provide strong immobile negative charges and may effectively terminate the dangling bonds around the surface of the fins 105. Hence, the carrier mobility performance in the channel region can be improved. In some embodiments, the second treatment TRMT-2 selectively passivates the region around the edges of the gate electrodes 112, such as portions of the dielectric layers 122 and 124 and the gate spacer 132 close to the LDD regions 142P. Such selective passivation causes the bulk and interface trap defects to be mitigated or reduced such that the chances of irregular charge recombination due to the traps are lowered.

The second treatment TRMT-2 may implant dopants with a dopant type, such as an n-type dopant, opposite to that of the ion implantation procedure IMP-1. In an embodiment, the second treatment TRMT-2 uses a dopant having an electronegativity greater than those of silicon or oxygen to obtain better passivation performance. For example, the second treatment TRMT-2 uses fluorine-containing gas, such as $NF_3$, HF, $SF_6$, $CF_4$ and $C_3F_8$. A gas flow of the fluorine gas is in a range between about 10 sccm and about 100 sccm. In some embodiments, the second treatment TRMT-2 is performed at an RF power, e.g., between about 0.5 KeV and about 2.0 KeV. In some embodiments, the RF power used by the second treatment TRMT-2 is less than that used by the ion implantation procedure IMP-1, in order not to interfere with the properties of the p-type LDD regions 142P. Likewise, in some embodiments, the second treatment TRMT-2 is performed at a dose substantially equal to or less than that used in the ion implantation procedure IMP-1 in order to cause the trap-repairing dopants to reach a relatively shallow depth around the surface 105S and maintain the properties of the LDD regions 142P. The trap-repairing dopants are implanted to reach a desired shallow depth around the surface 105S through proper control of the implantation parameters, such as the implantation dose and the tilted angle of the implantation in second treatment TRMT-2. For example, in some embodiments, the second treatment TRMT-2 utilizes an implantation dose between about 5E14 atoms/cm$^2$ and about 1.5E15 atoms/cm$^2$. In some embodiments, the ion implantation of second treatment TRMT-2 is performed with a tilted angle β between about 10° and 30°. An implantation using a dose beyond the range between about 5E14 atoms/cm$^2$ and about 1.5E15 atoms/cm$^2$ or a tilted angle β greater than about 30° or lower than 10° may not ensure the dopants to be implanted at desired locations and depths. In some embodiments, the ion implantation of second treatment TRMT-2 is performed for a duration less than that used in the ion implantation IMP-1 and may be, e.g., between about 0.5 seconds and 300 seconds.

Figure 15B:
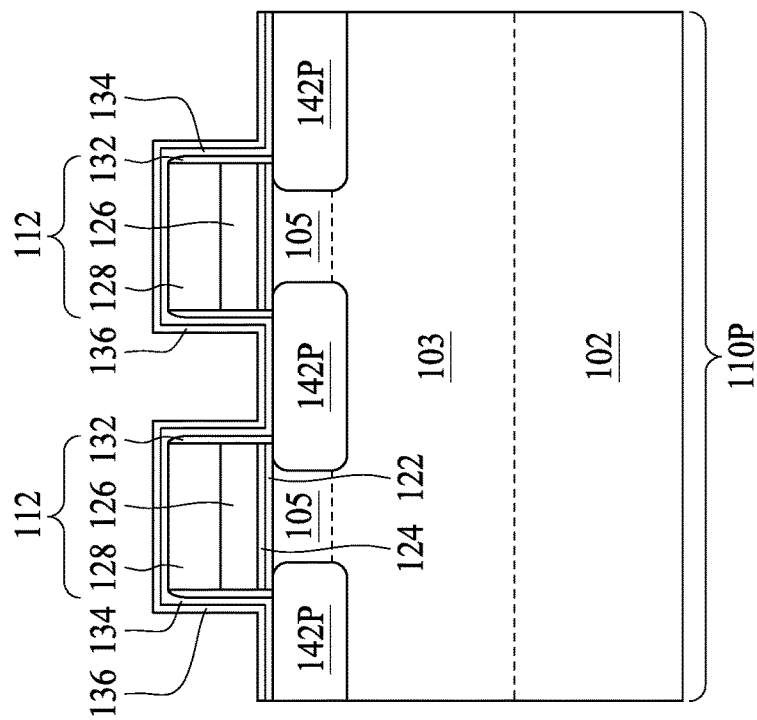
Figure 15A:
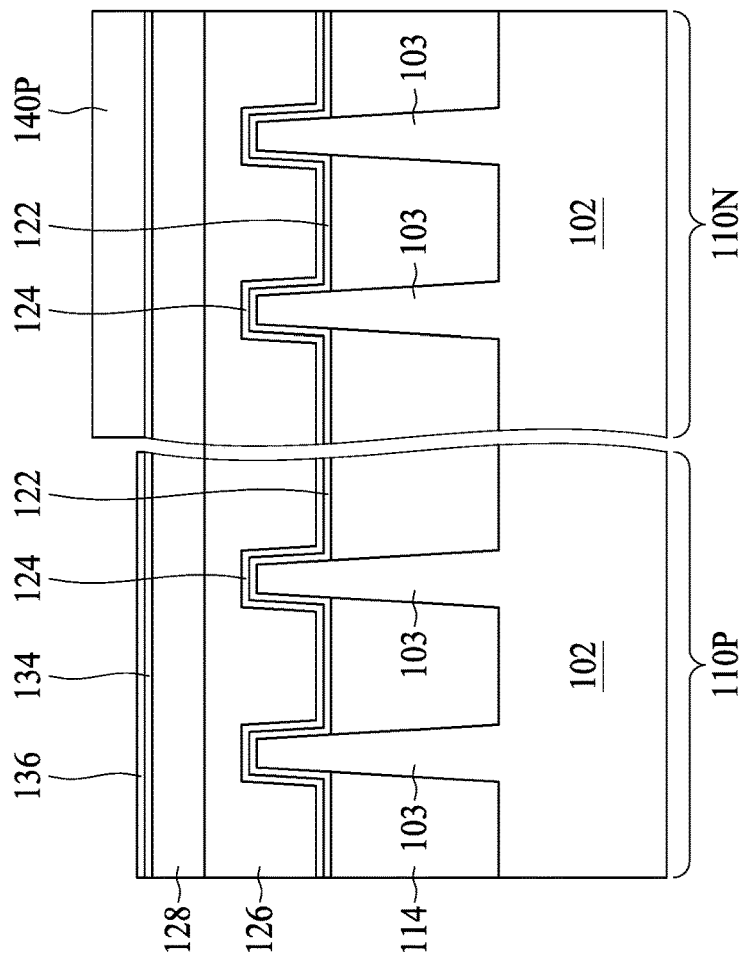

Referring to FIGS. 15A and 15B, a dielectric layer 136 is blanket formed on the p-type zone 110P, such as over the dielectric layer 134, the gate electrodes 112, and the fins 105. In some embodiments, the dielectric layer 136 may comprise silicon nitride (SiN), silicon oxynitride (SiON), silicon oxycarbide (SiOC), silicon carbonitride (SiCN), silicon carboxynitride (SiOCN), a combination thereof, or the like, and may be formed using CVD, ALD, a combination thereof, or the like. In some embodiments, the dielectric layers 134 and 136 comprise different materials. In some embodiments, the dielectric layer 136 comprises the same material as the gate spacer 132. The dielectric layer 136 may be also referred to as another gate spacer and its thickness may be used to control the widths of the subsequently-formed epitaxial source/drain regions in the fins 105. In some embodiments, the dielectric layer 136 has a thickness between about 5 nm and about 10 nm.

The formation of the dielectric layer 136 over the dielectric layer 134 may introduce bulk traps and interface traps around the dielectric layer 136. The present disclosure proposes schemes to mitigate the trap defects and improve the device performance.

Figure 16B:
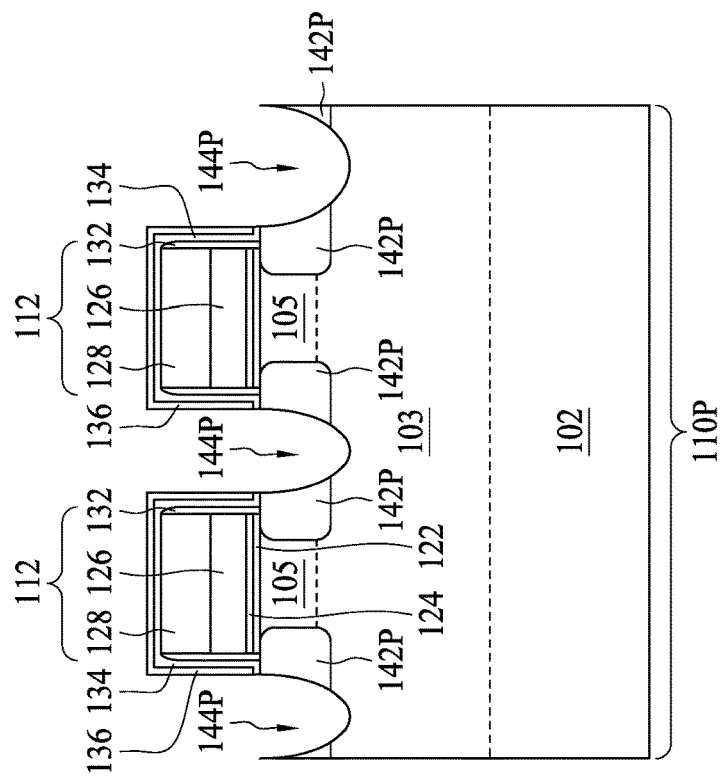
Figure 16A:
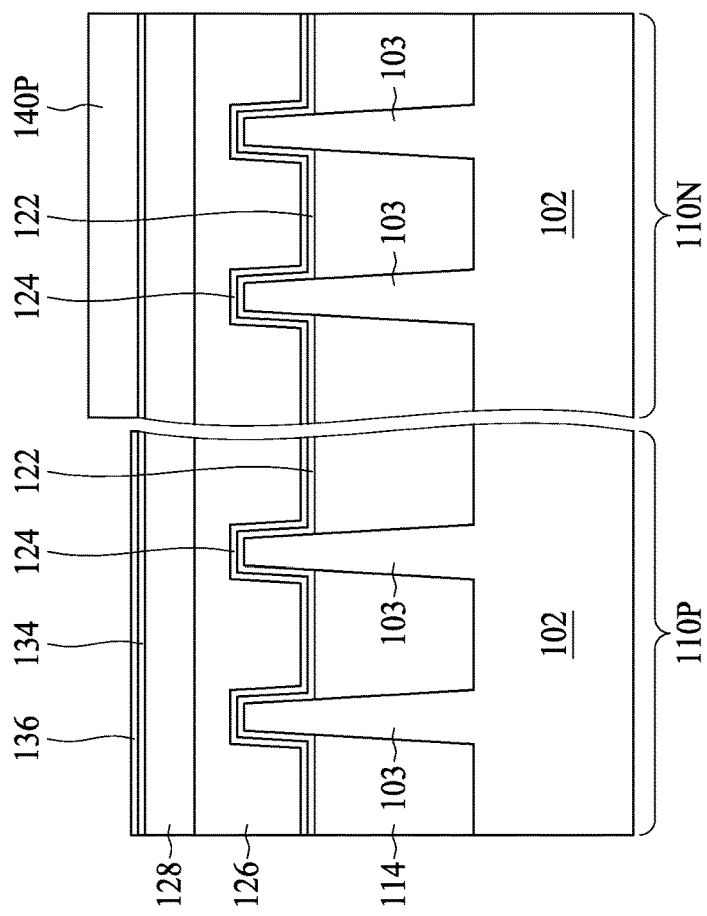

FIGS. 16A to 18B illustrate the formation of epitaxial source/drain regions (e.g., regions SD1 and SD2 in FIG. 1) in the p-type zone 110P. Referring to FIGS. 16A and 16B, a patterned mask (not shown) is initially formed over the gate electrodes 112 and expose source/drain regions in the LDD regions 142P. In some embodiments, the patterned mask layer may comprise a photoresist or the like, and may be formed using a spin-on process or the like.

Once the patterned mask is formed, a patterning process is performed on the dielectric layers 136 and 134 and the fins 105 to form recesses 144P in the source/drain LDD regions 142P. In some embodiments, the patterning process may include one or more suitable etch processes using the patterned mask as an etch mask. The etch processes may be anisotropic and may include a reactive ion etch (RIE), a neutral beam etch (NBE), a combination thereof, or the like. In some embodiments, sidewall portions of the dielectric layer 136 are not completely removed during the pattering of the recesses 144P, and the widths of the recesses 144P are defined by the dielectric layer 136. In some embodiments, multistep etching operations are performed to shape the recesses 144P having desired bottom shapes, such as a U-shape or a V-shape. After forming the recesses 144P, the patterned mask is stripped by an ashing or a wet clean step.

Figure 17B:
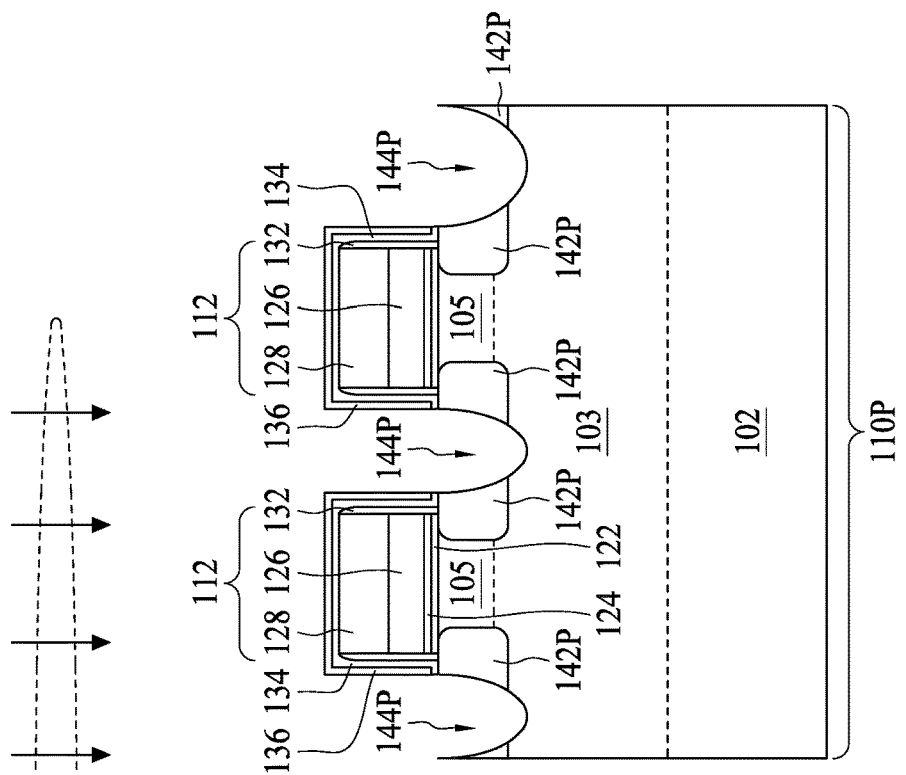
Figure 17A:
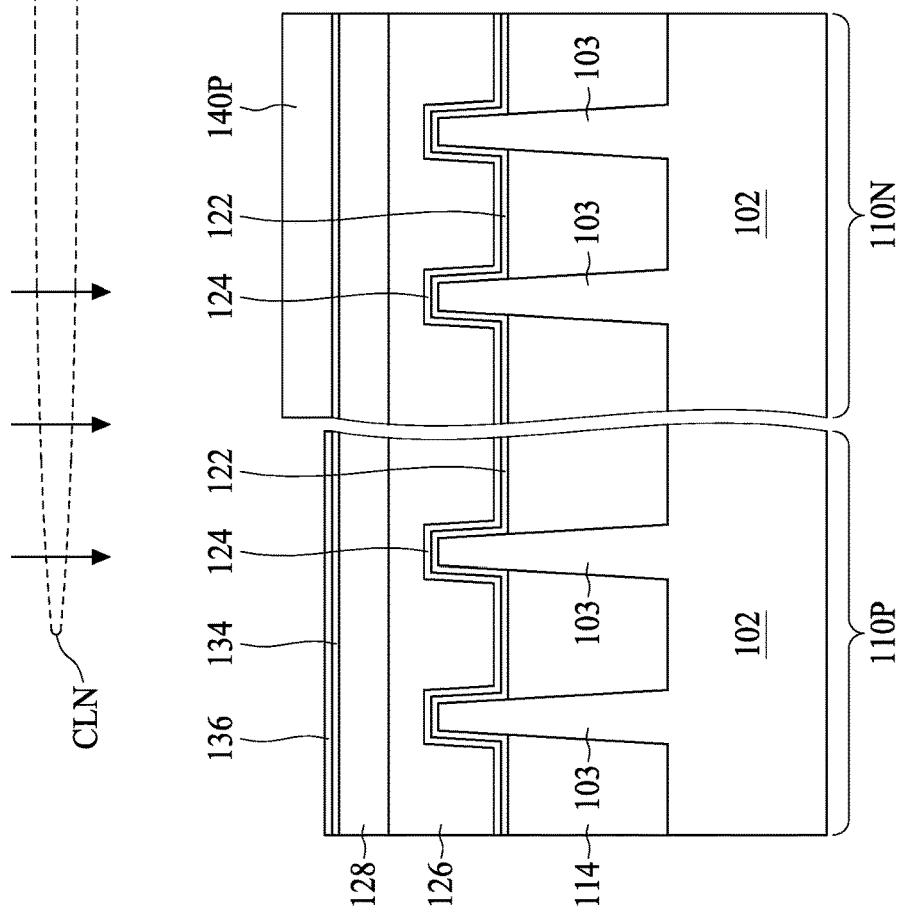

Subsequently, as shown in FIGS. 17A and 17B, a cleaning step CLN is performed on the recesses 144P. An example cleaning step includes using hydrofluoric acid (HF), trisborate-ethylene diamine tetraacetic acid (TBE), a buffered oxide etch (BOE), the like, or a combination thereof. In some embodiments, some loss of material of the fins 105 or a further dishing effect on the recesses 144P may occur due to the etching effect of the cleaning operation CLN. This in turn causes the occurrence of surface defects and/or bulk traps of the fins 105 and the dielectric layers 134 and 136.

Referring to FIGS. 18A and 18B, epitaxial source/drain regions 146P, corresponding to the source/drain regions SD1 and SD2 in FIG. 1, are formed in the recesses 144P. In some embodiments, the epitaxial source/drain regions 146P are epitaxially grown in the recesses 144P using metal-organic CVD (MOCVD), molecular beam epitaxy (MBE), liquid phase epitaxy (LPE), vapor phase epitaxy (VPE), selective epitaxial growth (SEG), a combination thereof, or the like.

In some embodiments, the epitaxial source/drain regions 146P for a p-type transistor may include SiGe, SiGeB, Ge, GeSn, or the like. As shown in FIG. 18B, surfaces of the epitaxial source/drain regions 146P may be raised from the surface 105S and may include facets. In some embodiments, the bottoms of the epitaxial source/drain regions 146P may extend past the LDD regions 142P and into the semiconductor strips 103. In the illustrated embodiment, each of the epitaxial source/drain regions 146P are physically separated from each other, however, adjacent epitaxial source/drain regions 146P on a same side of the gate electrode 112 (e.g., two neighboring source drain regions SD1 in FIG. 1) may be merged along the sidewall of the gate electrode 112 in other embodiments. In some embodiments, the material of the epitaxial source/drain regions 146P may be doped in a doping process similar to the process used for forming the LDD regions 142P.

Figure 19B:
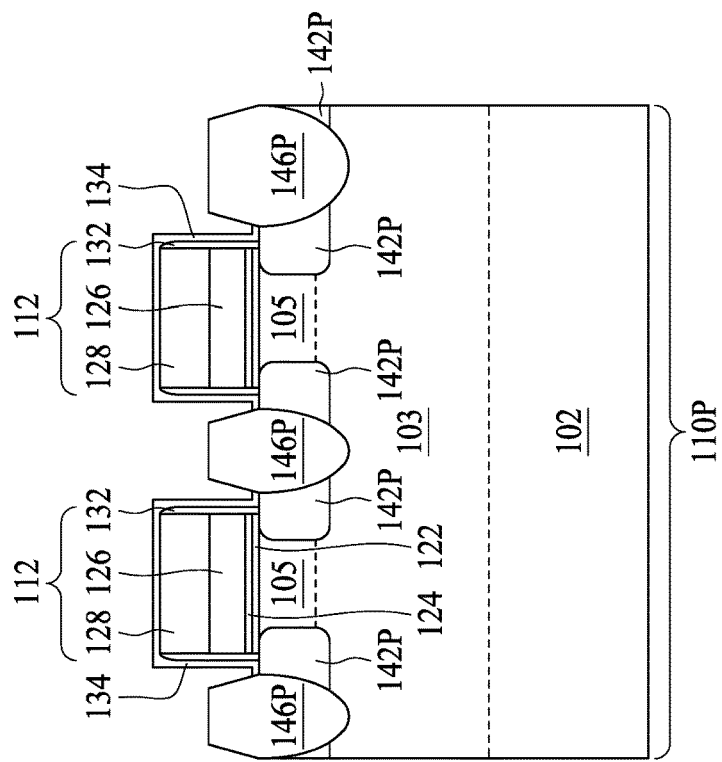
Figure 19A:
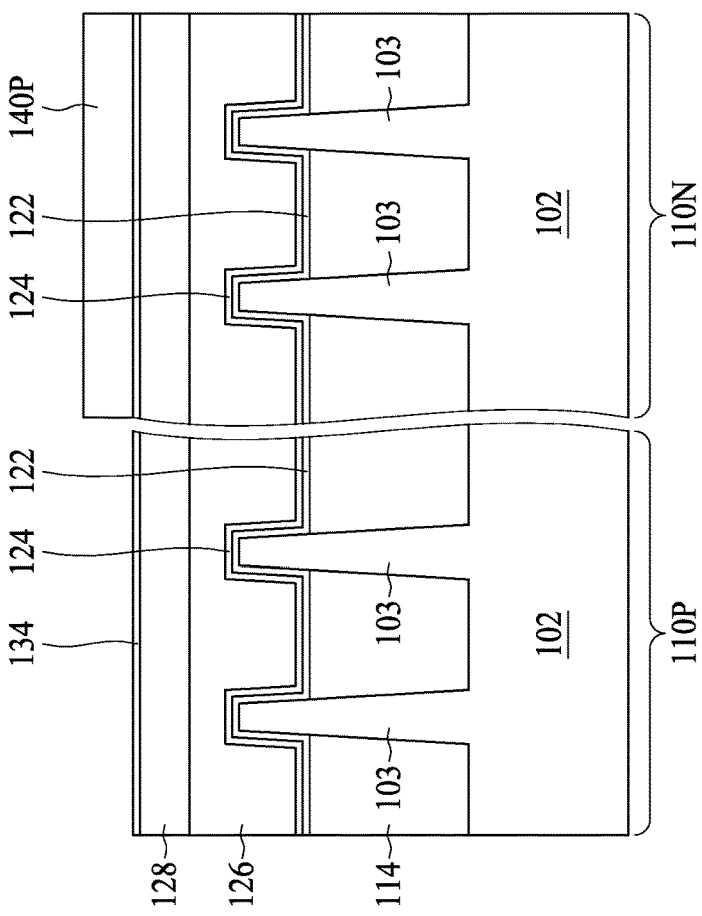

After the epitaxial source/drain regions 146P are formed, the remaining portions of the dielectric layer 136 are removed, as illustrated in FIGS. 19A and 19B. In some embodiments, the dielectric layer 136 may be removed using a suitable etch process that is selective to the material of the dielectric layer 136. Once the p-type epitaxial source/drain regions 146P are formed, the photoresist 140P may be stripped using an ashing or wet etching process.

Figure 20B:
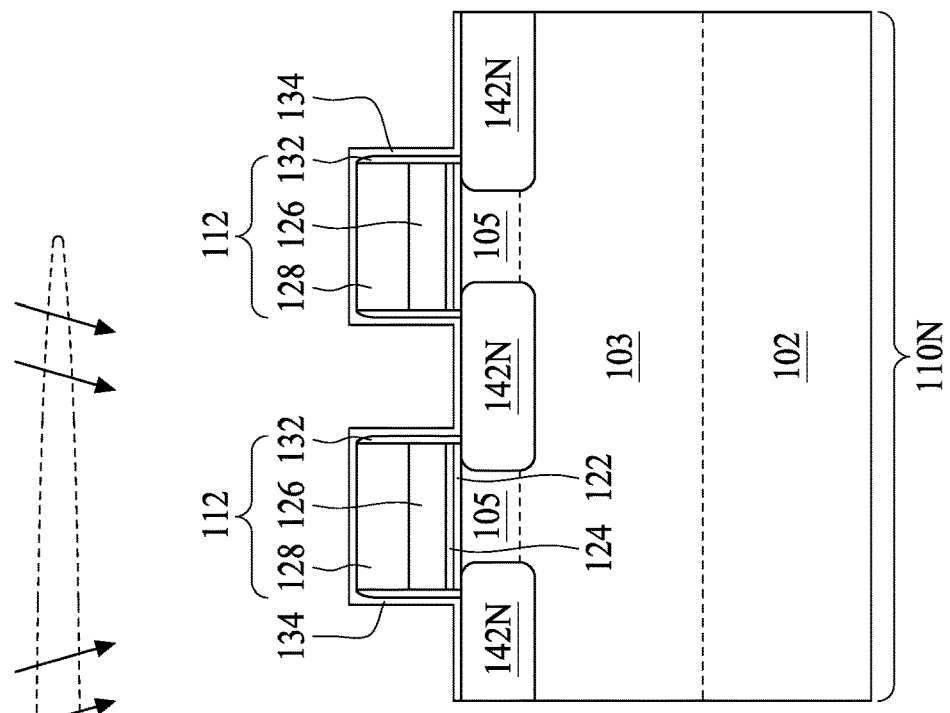
Figure 20A:
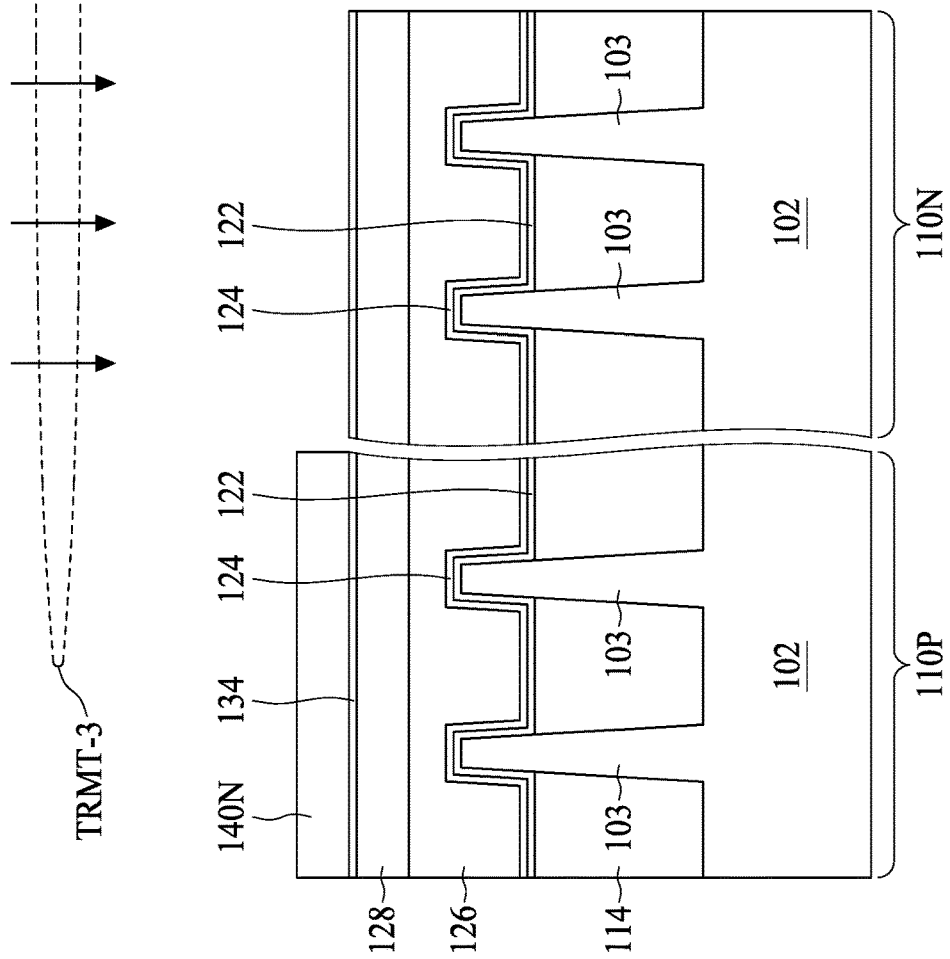
Figure 21B:
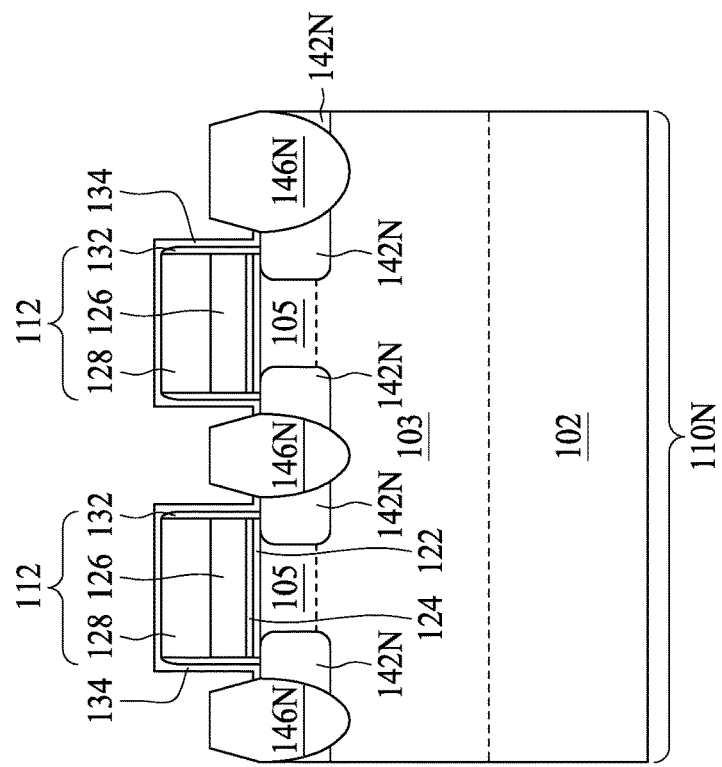

FIGS. 20A to 21B illustrate the formation of epitaxial source/drain regions 146N in the n-type zone 110N of the semiconductor device 100. FIGS. 20B and 21B are taken along cross sections BB in a fin 105 of the n-type zone 110N. The configuration, materials and methods of forming the epitaxial source/drain regions 146N in the n-type zone 110N illustrated in FIGS. 20A, 20B, 21A and 21B are similar to the configuration, materials and methods of their counterparts in the p-type zone 110P, except where stated otherwise. Referring to FIGS. 20A and 20B, a photoresist 140N is used to mask the p-type zone 110P while exposing the n-type zone 110N. An ion implantation step (IMP-2, not shown) and a third treatment TRMT-3 are subsequently or concurrently performed to form the n-type LDD regions 142N in the fins 105. These steps are similar to the steps shown in FIGS. 13A to 14B, except that the dopants of the n-type LDD regions 142N are n-type dopants, such as arsenic, phosphorus or the like.

The third treatment TRMT-3 may include an implantation procedure of a trap-repairing element to passivate the surface 105S of the fins 105, the gate spacer 132, the LDD regions 142N or the dielectric layer 134. The passivating ions supplied by the third treatment TRMT-3 toward the LDD regions 142N may provide strong immobile negative charges and may effectively terminate the dangling bonds around the surface 105S. In some embodiments, the third treatment TRMT-3 selectively passivates the region around the edge of the gate electrode 112, such as portions of the gate spacer 132 and the dielectric layer 134 close to the LDD regions 142N, wherein the bulk and interface trap defects are mitigated or reduced such that the chances of irregular charge recombination due to the trap defects are lowered.

The third treatment TRMT-3 may implant dopants with a dopant type, such as an n-type dopant, similar to the dopants of the ion implantation procedure of the n-type LDD regions 142N. In an embodiment, the third treatment TRMT-3 uses a dopant having an electronegativity greater than those of silicon or oxygen to obtain better passivation performance. For example, the third treatment TRMT-3 uses fluorine-containing gas, such as $NF_3$, HF, $SF_6$, $CF_4$ and $C_3F_8$. A gas flow of the fluorine gas is in a range between about 10 sccm and about 100 sccm. In some embodiments, the third treatment TRMT-3 is performed at an RF power, e.g., between about 0.5 KeV and about 2.0 KeV. In some embodiments, the RF power used by the third treatment TRMT-3 is less than that used in the ion implantation procedure IMP-2 in order not to interfere with the properties of the LDD regions 142N. Likewise, in some embodiments, the ion implantation of the third treatment TRMT-3 utilizes a dose between about 5E14 atoms/cm$^2$ and about 1.5E15 atoms/cm$^2$, in order to cause the trap-repairing dopants to reach a relatively shallow depth around the surface 105S and maintain the properties of the LDD regions 142N. In some embodiments, the third treatment TRMT-3 is performed using a tilted implantation with a tilt angle between about 10° and 30°. In some embodiments, the third treatment TRMT-3 is performed for a duration between about 0.5 seconds and about 300 seconds.

Figure 21A:
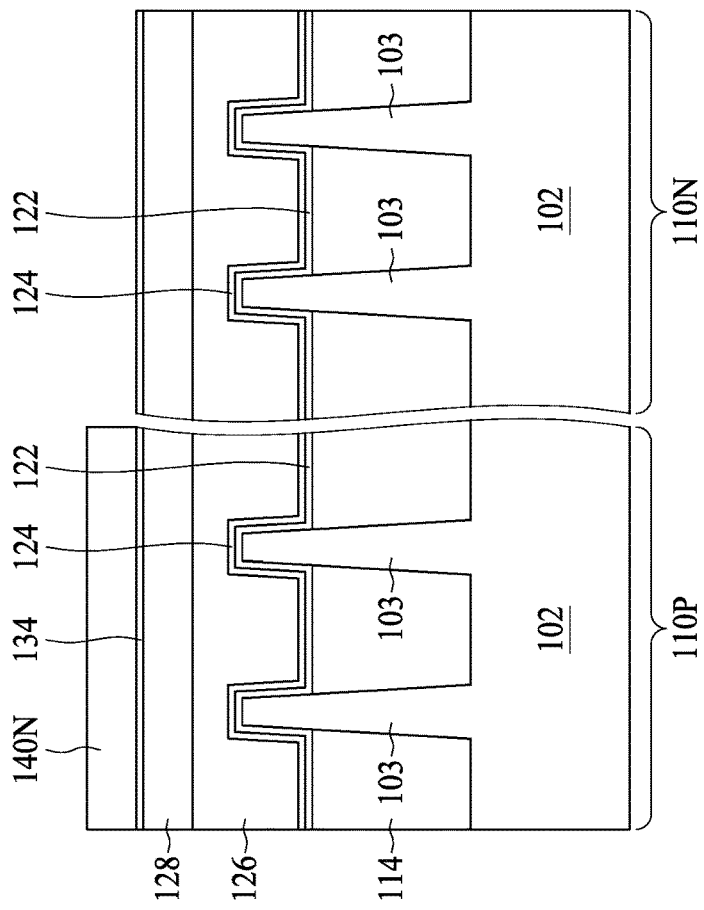

FIGS. 21A and 21B show a result of forming the dielectric layer 136, etching the recesses 144N in the fins 105, cleaning the recesses 144N, epitaxially growing source/drain regions 146N in the recesses 144N, and removing the dielectric layer 136. The above-mentioned steps are similar to the steps shown in FIGS. 15A to 19B, except that the dopants of the n-type LDD regions 142N are n-type dopants, such as arsenic, phosphorus or the like. After the dielectric layer 136 is removed, the as-formed semiconductor device 100 in the n-type zone 110N shown in FIGS. 21A and 21B exhibits configurations similar to those of the p-type zone 110P as illustrated in FIGS. 19A and 19B. Once the n-type epitaxial source/drain regions 146N are formed, the photoresist 140N may be stripped using an ashing or wet etching process.

Figure 22B:
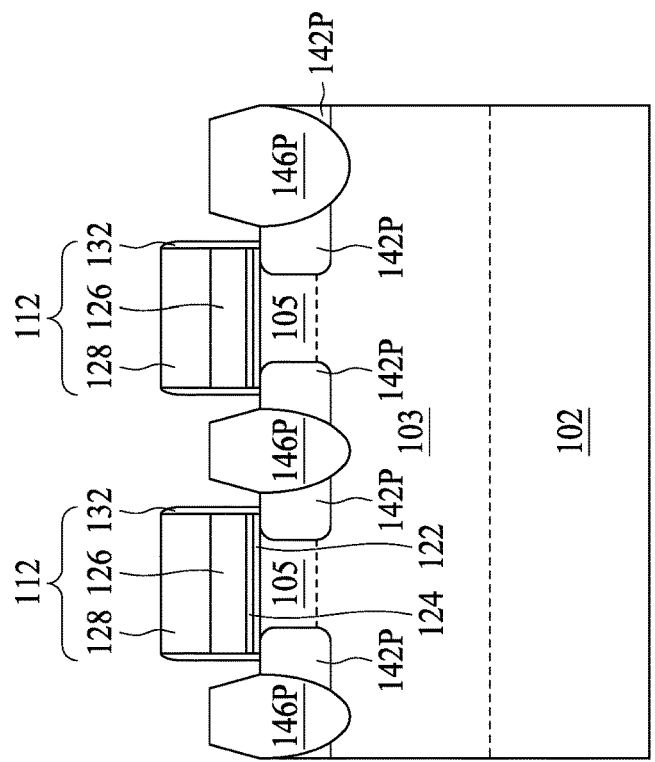
Figure 22A:
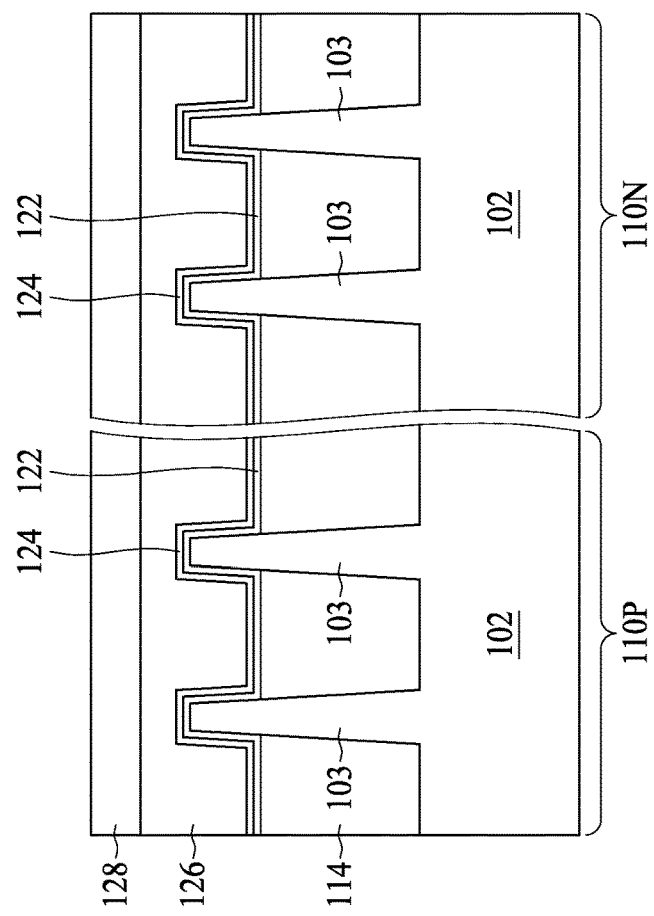

FIGS. 22A and 22B demonstrate removal of the dielectric layer 134 in both the p-type zone 110P and the n-type zone 110N after the epitaxial source/drain regions 146P and 146N are formed. FIG. 22B illustrates a cross-sectional view of the p-type zone 110P as an example. In some embodiments, the dielectric layer 134 may be removed using a suitable etch process that is selective to the material of the dielectric layer 134.

Figure 23B:
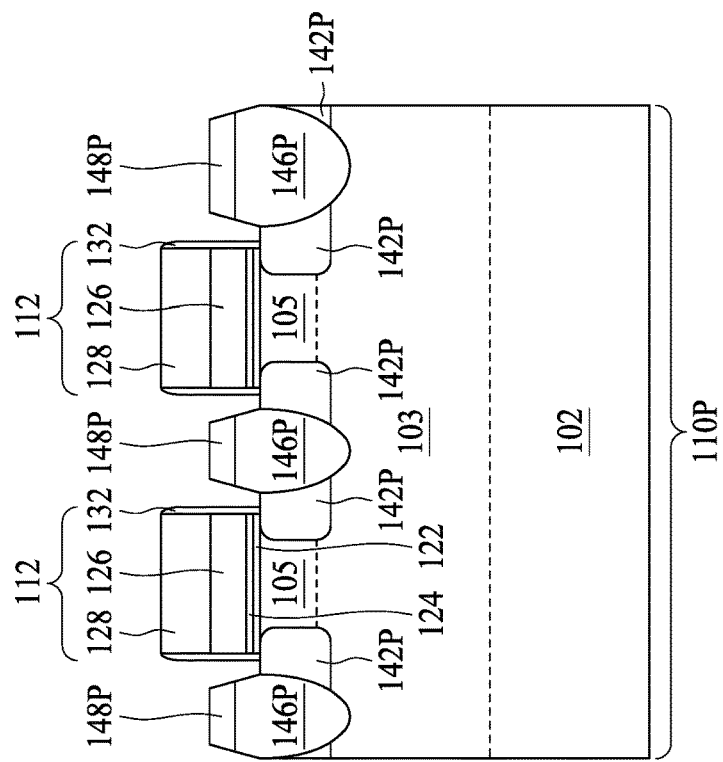
Figure 23A:
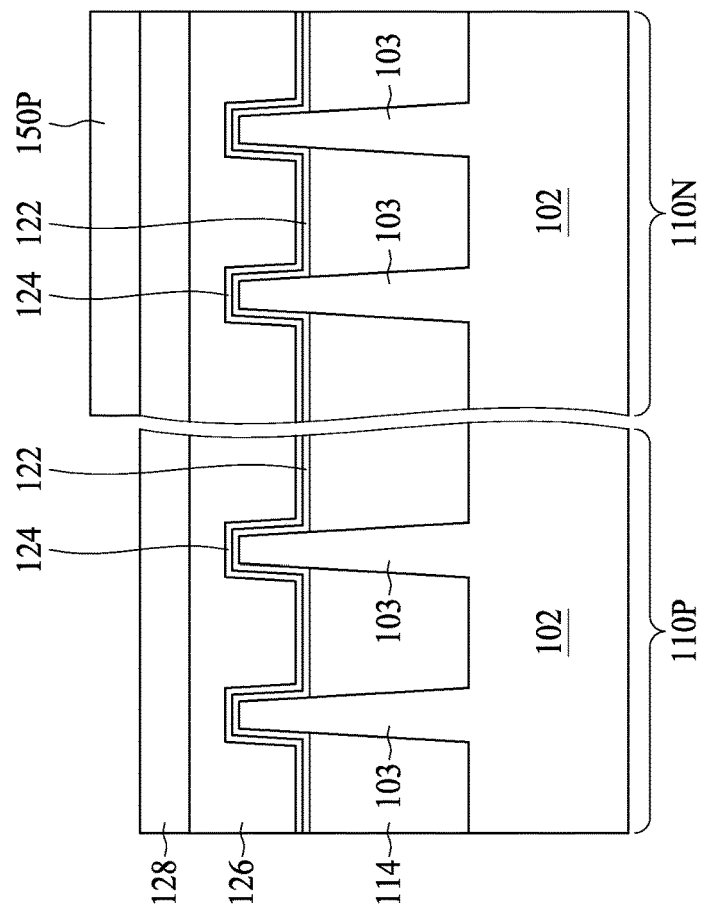

Referring to FIGS. 23A and 23B, a p-type implantation operation is performed on the p-type source/drain regions 146P to form P+ doped regions 148P. A photoresist 150P is deposited to mask the n-type zone 110N and expose the p-type zone 110P. The photoresist 150P may be patterned to expose only the source/drain regions 146P. The implantation operation may produce the P+ doped regions 148P having a doping concentration greater than those of the underlying source/drain regions 146P in order to improve the electrical performance of the source/drain regions 146P. The doped regions 148P may cover the entire upper surfaces of the respective source/drain regions 146P. In some embodiments, the P+ doped regions 148P have a doping concentration between about 1E20 atoms/cm$^3$ and about 3E21 atoms/cm$^3$. After the P+ doped regions 148P are formed, the photoresist 150P may be stripped.

Figure 24B:
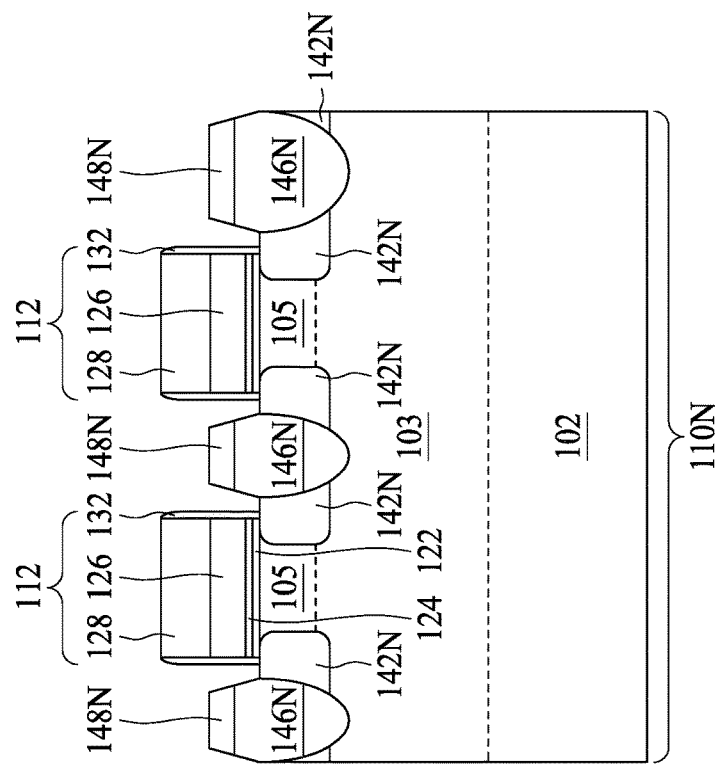
Figure 24A:
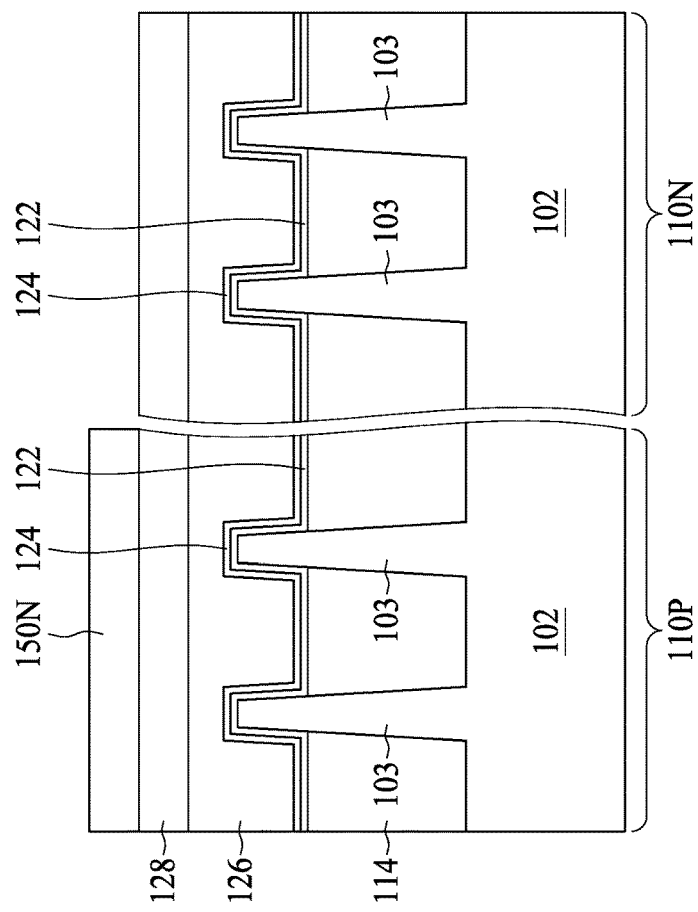

Similarly, referring to FIGS. 24A and 24B, an n-type implantation operation is performed on the n-type source/drain regions 146N to form N+ doped regions 148N. A photoresist 150N is deposited to mask the p-type zone 110P and expose the source/drain regions 146N in the n-type zone 110N. The implantation operation may produce the doped regions 148N having a doping concentration greater than those of the underlying source/drain regions 146N in order to improve the electrical performance of the source/drain regions 146N. The doped regions 148N may cover the entire upper surfaces of the respective source/drain regions 146N. In some embodiments, the doped regions 148N have a doping concentration between about 1E20 atoms/cm$^3$ and about 3E21 atoms/cm³. After the N+ doped regions 148N are formed, the photoresist 150N may be stripped.

FIGS. 25A and 25B illustrate an annealing operation ANL performed over the entire semiconductor device 100. The annealing operation ANL may aid in activating the dopants in the doped regions 148P and 148N. The annealing operation ANL may include an RTA or furnace anneal. In some embodiments, the annealing operation ANL includes less than about 5 hours of furnace annealing and may be less than about 10 minutes of RTA annealing. In an embodiment, the annealing operation ANL is performed until the implantation damage is reduced to a predetermined amount in the doped regions 148P and 148N. The annealing operation ANL may be performed at a temperature greater than about 900° C., such as 1050° C. The annealing operation ANL may be conducted in an inert gas such as argon or nitrogen.

Referring to FIGS. 26A and 26B, an interlayer dielectric (ILD) layer is formed over the gate electrodes 112, the epitaxial source/drain regions 146P and 146N and the fins 105. FIG. 26B shows the cross-sectional view of the p-type zone as an example (the same is true for FIGS. 27B, 28B, 29B, 30B, 31B, 32B and 33B). The ILD layer 151 may be deposited to fill the spaces between the gate electrodes 112 and the fins 105. In some embodiments, the ILD layer 151 is formed of a dielectric material such as silicon oxide, SiOC, $ZrO_2$, $HfO_2$, Phosphosilicate Glass (PSG), Borosilicate Glass (BSG), Boron-Doped Phospho-Silicate Glass (BPSG), undoped Silicate Glass (USG), low-k dielectric materials, extremely low-k dielectric materials, high-k dielectric materials, a combination thereof, or the like, and may be deposited by any suitable method, such as CVD, PECVD, spin-on coating, a combination thereof, or the like.

In some embodiments, prior to the formation of the ILD layer 151, one or more additional dielectric layers (not shown) are deposited on the gate electrodes 112, the epitaxial source/drain regions 146P and 146N and the fins 105. These dielectric layers may be used as an etch stop layer or a capping layer while patterning the ILD layer 151 to etch openings for subsequently formed contact plugs. In some embodiments, some of these dielectric layers may be formed in a conformal manner using materials and methods similar to those used in the forming of the dielectric layer 132D or 134.

Figure 27B:
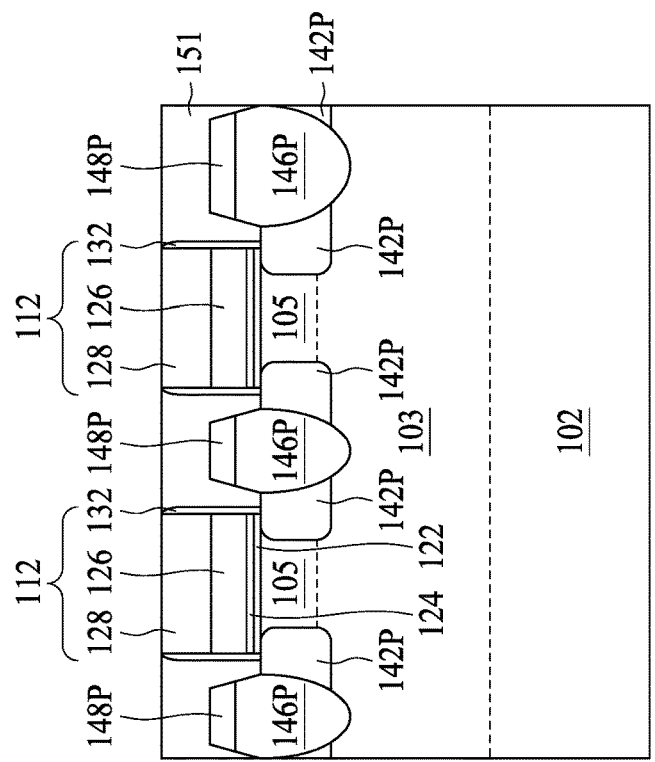
Figure 27A:
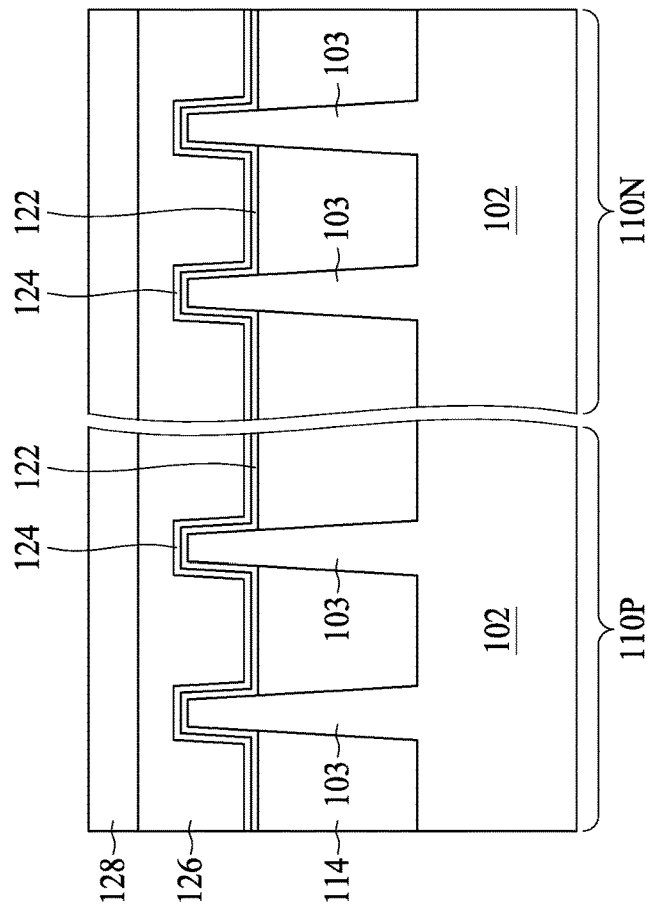

Referring to FIGS. 27A and 27B, a planarization process, such as CMP or mechanical grinding, may be performed to level a top surface of the ILD layer 151 with the top surfaces of the gate electrodes 112. In some embodiments, the planarization process also removes the patterned mask layer 128, or portions of the gate spacer 132 that extend over the top surface of the planarized gate electrodes 112.

Figure 28B:
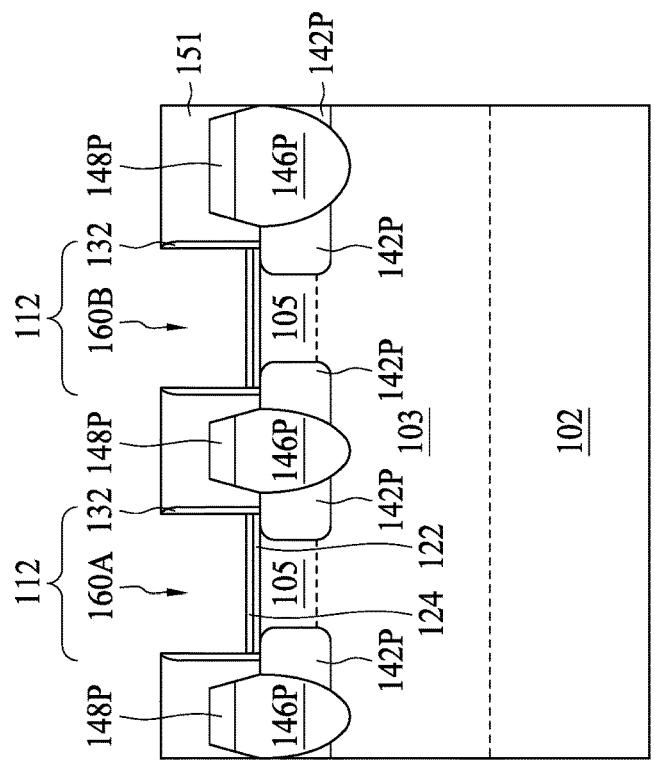
Figure 28A:
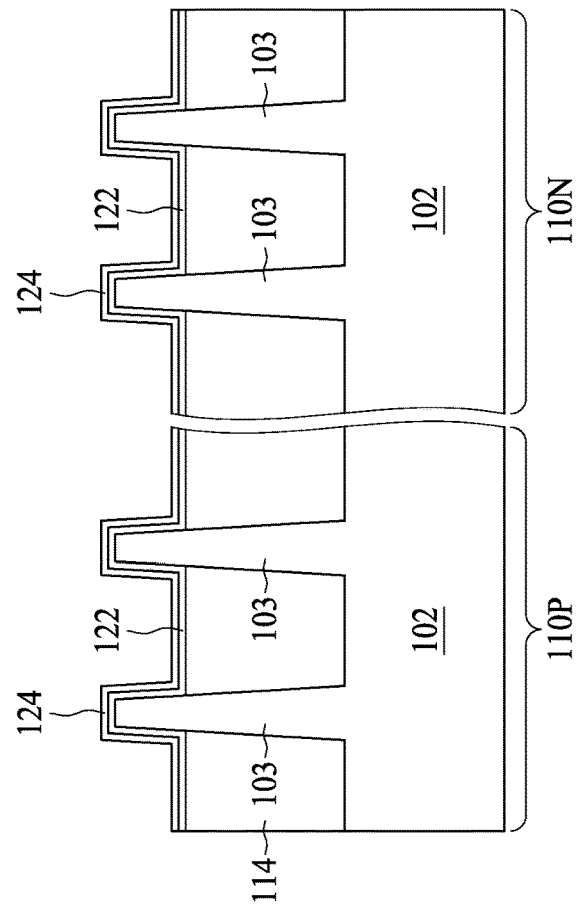
Figure 29B:
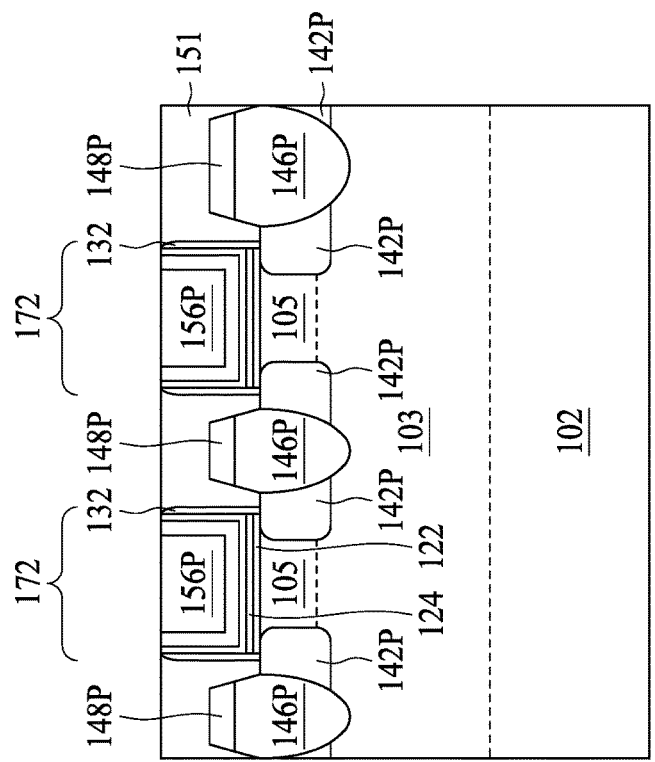
Figure 29A:
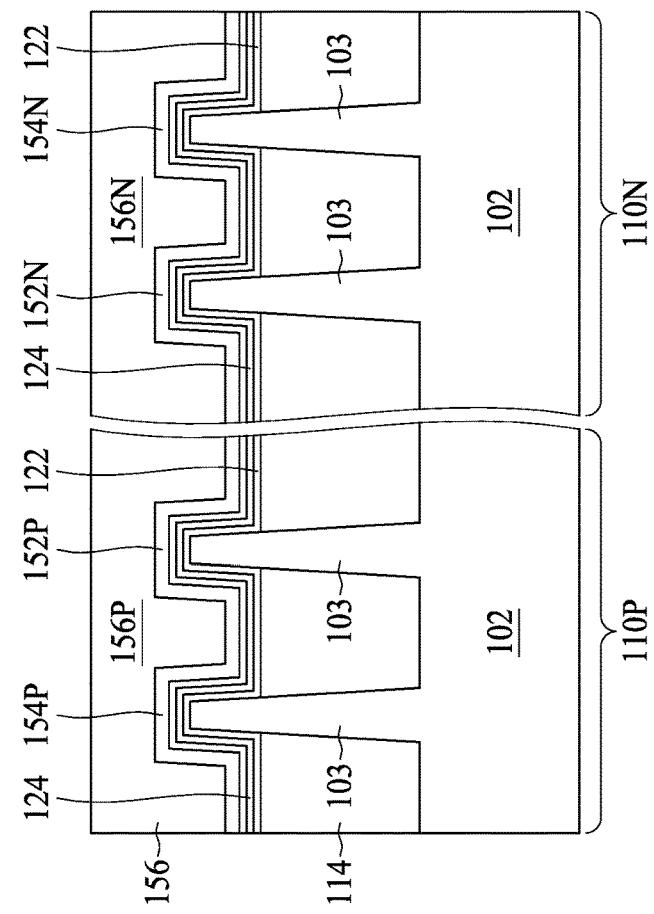

FIGS. 28A and 28B and FIGS. 29A and 29B illustrate a gate replacement process for forming replacement gates 172. Initially, as shown in FIGS. 28A and 28B, the patterned mask layer 128 and the patterned gate electrode 126 of the dummy gate electrodes 112 are removed using one or more suitable etch processes to form openings 160. Each of the openings 160 exposes a respective underlying dielectric layer 124. In the illustrated embodiment, the dielectric layers 124 and 122, serving as the high-k dielectric layer and the gate dielectric layer (interfacial layer), respectively, of the replacement gates 172A and 172B, remain over the channel regions of the fins 105 during the etching operation. In other embodiments, the dielectric layers 122 and 124 may also be removed during the formation of the openings 160 and may be deposited in place in subsequent steps. In embodiments where the dielectric layers 122 and 124 are also be removed, these layers may be deposited into the openings 160 in a conformal manner, and the materials and method of forming of these layers are similar to those illustrated with reference to FIGS. 6A and 6B.

A capping layer 152P or 152N is formed over the gate dielectric layer 124 in the p-type zone 110P or n-type zone 110N, respectively. In some embodiments, the capping layer 152P or 152N is formed along sidewalls and bottoms of the openings 160 by any suitable process to any suitable thickness. For example, the capping layer 152P or 152N is formed by an ALD or PVD process to a thickness, e.g., between about 20 Å and about 40 Å. The capping layer 152P or 152N may comprise titanium, titanium nitride, tantalum, tantalum nitride, other suitable materials, or combinations thereof.

Work function layers 154P and 154N are formed over the capping layers 152P and 152N, respectively. In embodiments of an n-type transistor of the n-type zone 110N, the work function layer 154N comprises Ti, Ag, Al, TiAl, TiAlN, TiAlC, TaC, TaCN, TaSiN, TaAlC, Mn, Zr, a combination thereof, or the like, and may be formed along sidewalls and bottoms of the openings 160 using ALD, CVD, PVD, combinations thereof, or the like. In embodiments of a p-type transistor of the p-type zone 110P, the work function layer 154P comprises TiN, WN, TaN, Ru, Co, a combination thereof, or the like, and may be formed along sidewalls and bottoms of the openings 160 using ALD, CVD, PVD, combinations thereof, or the like. After the forming of the work function layers 154P and 154N, the openings 160 are filled with a conductive layer 156P or 156N. In some embodiments, the conductive layer 156P or 156N comprises Co, Ru, Al, Ag, Au, W, Ni, Ti, Cu, Mn, Pd, Re, Ir, Pt, Zr, alloys thereof, combinations thereof, or the like, and may be formed using ALD, CVD, PVD, plating, combinations thereof, or the like.

After the openings 160 are filled with the capping layers 152P and 152N, the work function layers 154P and 154N, and the conductive layers 156P and 156N, a planarization process, such as a CMP process, may be performed to remove excess portions of these layers over the top surface of the ILD layer 151. The dielectric layers 122 and 124, the capping layer 152P or 152N, the work function layer 154P or 154N, and the conductive layer 156P or 156N collectively form the respective replacement gate 172.

Figure 30B:
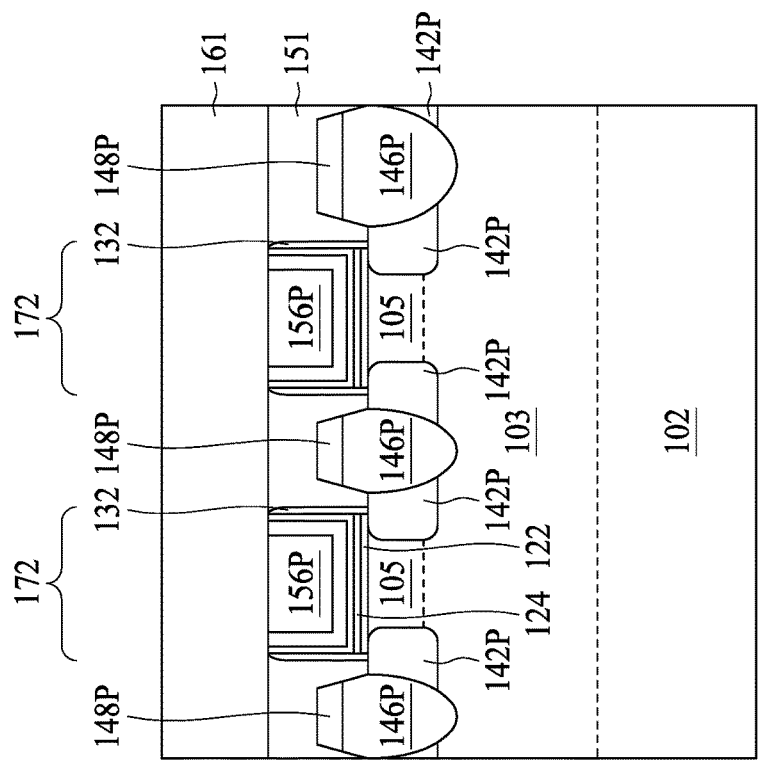
Figure 30A:
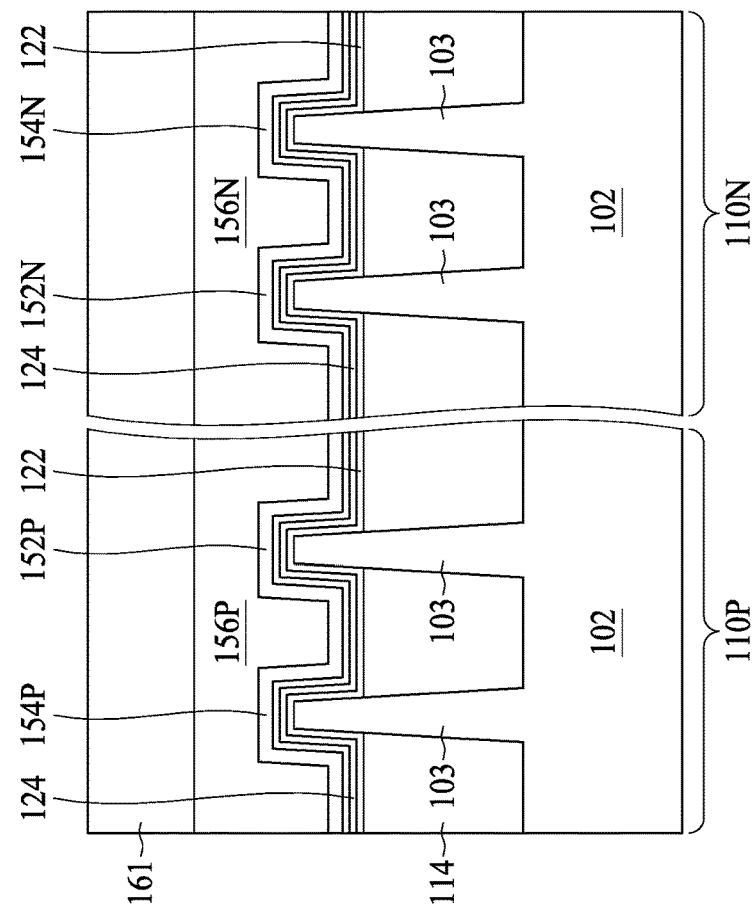

Referring to FIGS. 30A and 30B, another ILD layer 161 is formed over the replacement gates 172 and the ILD layer 151. In some embodiments, the ILD layer 161 may be formed using materials and methods similar to those used to form the ILD layer 151 described with reference to FIGS. 26A and 26B. In some embodiments, the ILD layers 151 and 161 are formed of a same material. In other embodiments, the ILD layers 151 and 161 are formed of different materials. A planarization process, such as a CMP process, may be performed to remove excess portions of the ILD material to form a top surface of the ILD layer 161.

Subsequently, as shown in FIGS. 31A and 31B, the ILD layers 151 and 161 are patterned to form openings 162G and 162SD. In some embodiments, the ILD layers 151 and 161 may be patterned using suitable photolithography and etching techniques. The openings 162G expose the respective replacement gates 172 in either the p-type zone 110P or n-type zone 110N. The openings 162SD expose the epitaxial source/drain regions 146P and 146N in the respective p-type zone 110P and n-type zone 110N.

In some embodiments, self-aligned silicide (salicide) layers (not shown) are formed in the openings 162G and 152SD. The silicide layers may be formed by depositing a metallic material in the openings 162G or 162SD, followed by an annealing operation. The metallic material may comprise Ti, Co, Ni, NiCo, Pt, NiPt, Ir, PtIr, Er, Yb, Pd, Rh, Nb, a combination thereof, or the like, and may be formed using PVD, sputtering, or the like. The metal silicide layers are formed by reacting the silicon in the source/drain regions with the metallic material during the annealing operation.

Figure 32B:
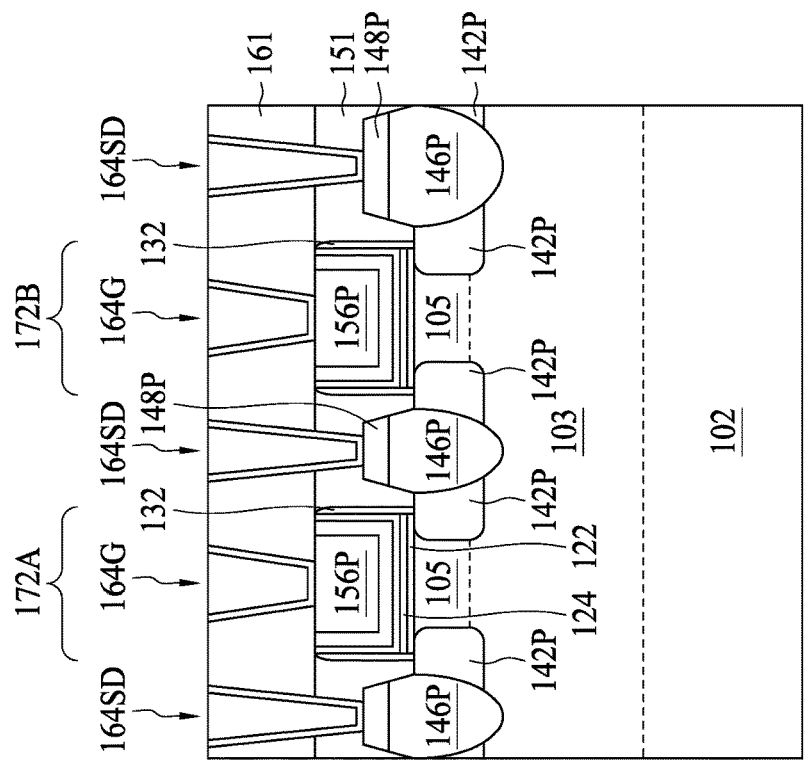
Figure 32A:
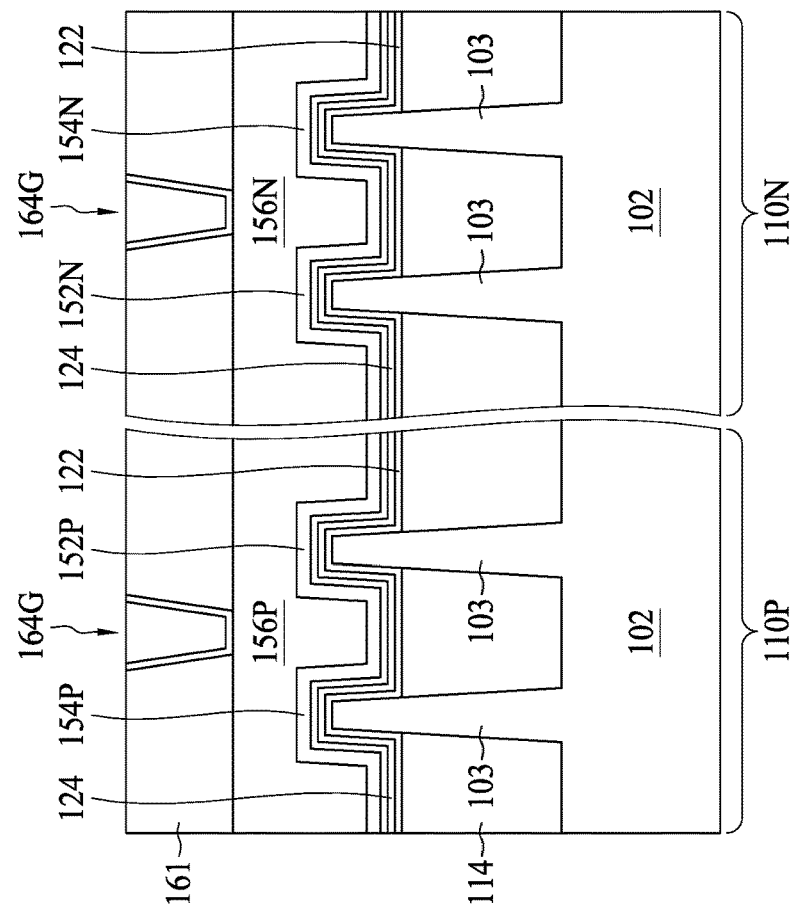

Referring to FIGS. 32A and 32B, conductive materials are deposited into the openings 162G and 162SG to form contact plugs 164G and 164SD, respectively. The contact plugs 164G and 164SD are electrically coupled to the replacement gates 172 and source/drain regions 146P/146N, respectively, through the silicide layers. In some embodiments, the contact plugs 164G and 164SD may include a liner and a filling layer over the liner. The liner may serve as a diffusion barrier layer or an adhesion layer between the ILD layers 151/161 and the filling layer. The liner may include titanium, titanium nitride, tantalum, tantalum nitride, a combination thereof, or the like, and may be formed using CVD, PVD, ALD, a combination thereof, or the like. The filling layer may be copper, a copper alloy, silver, gold, tungsten, aluminum, nickel, a combination thereof, or the like, and may be formed using CVD, PVD, ALD, an electrochemical plating process, an electroless plating process, a combination thereof, or the like.

A planarization process, such as a CMP process, may be performed to remove excess portions of the liner and the filling layer from a top surface of the ILD layer 161. The remaining portions of the liner and the filling layer form contact plugs 164G and 164SD.

Figures 33A, 33B:
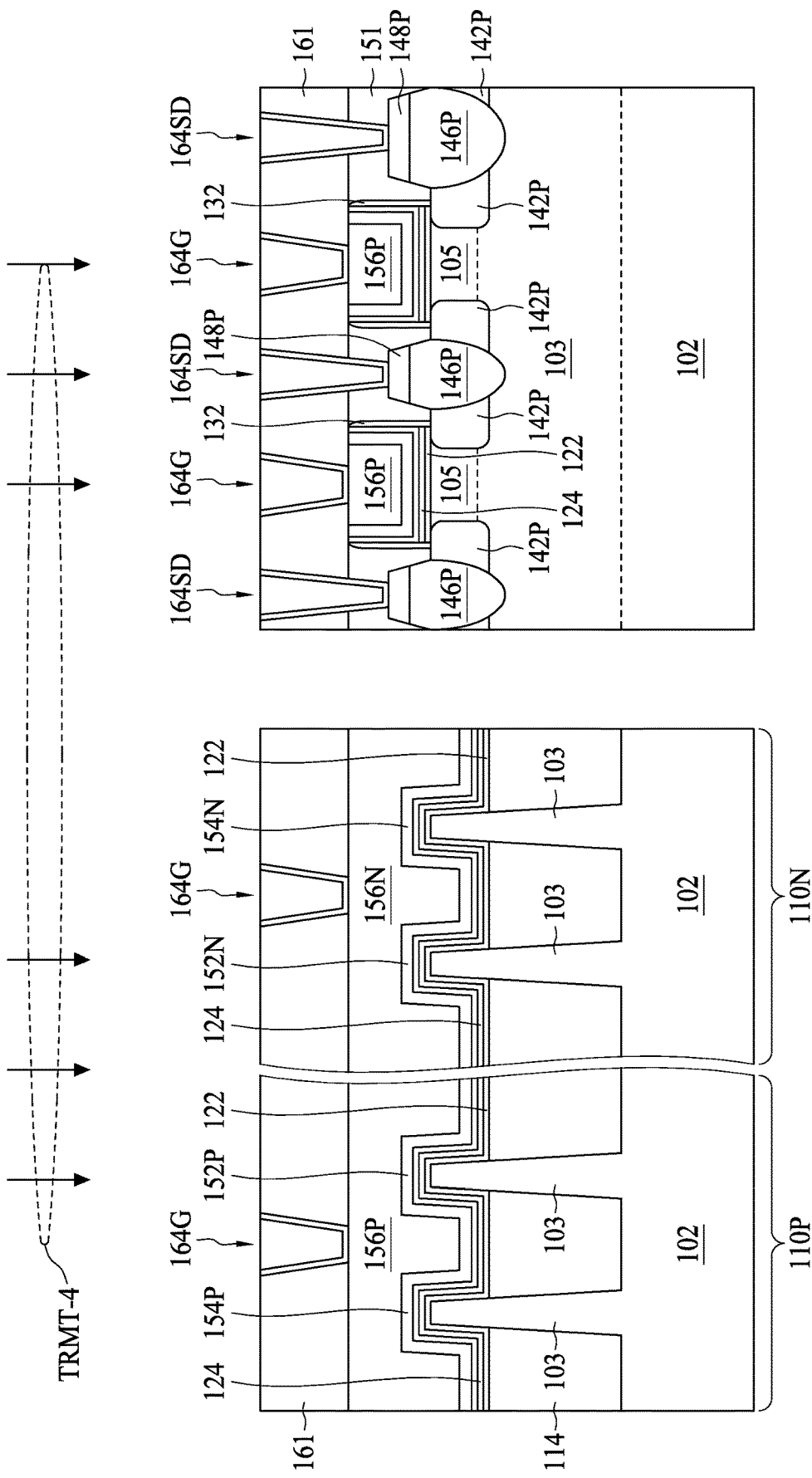

Referring to FIGS. 33A and 33B, a fourth treatment TRMT-4 is performed, in which a trap-repairing element is employed to repair the trap defects that have been caused by preceding operations to the as-formed semiconductor device 100. In some embodiments, the trap defects may occur within any of the layers, or on the surfaces of the layers, of the semiconductor device 100 after the process of the preceding treatments TRMT-1, TRMT-2 and TRMT-3, and thus the fourth treatment TRMT-4 is used to passivate the remaining or new detects. In some embodiments, the trap-repairing element of the fourth treatment TRMT-4 has an electronegativity less than that of the trap-repairing element of the second or third treatment (TRMT-2 or TRMT-3) while having a better penetration capability to pass through various layers into the vicinity of the channel region where the trap resides in order to terminate the dangling bonds. In some embodiments, the trap-repairing element of the fourth treatment TRMT-4 has an atomic mass less than that of the trap-repairing element in the preceding trap-repairing treatments TRMT-1 to TRMT-3 so as to obtain a better penetration capability. In some embodiments, the fourth treatment TRMT-4 adopts an annealing with $H_2$ ambient. In an embodiment, an annealing using hydrogen-containing gas at a high-pressure level, e.g., between about 10 atm and 20 atm, is performed in the fourth treatment TRMT-4. In some embodiments, the fourth treatment TRMT-4 is performed at a temperature, such as 700° C. or below, that is less than the temperature used in the second treatment TRMT-2 or the third treatment TRMT-3, in order not to break the newly formed trap-repairing element off the terminated dangling bonds. In some embodiments, the fourth treatment TRMT-4 is performed at a temperature, such as 500° C. or below. In some embodiments, the fourth treatment TRMT-4 is performed at a temperature, such as 400° C. or below.

In embodiments where annealing operations, such as the annealing steps for forming the silicide layers at an elevated temperature greater than that used in the fourth treatment TRMT-4, are not employed during the formation of the contact plugs 164G and 164SD, or where no high-temperature annealing (e.g., greater than about 400° C., 500° C. or 700° C.) is performed in forming the contact plugs 164G and 164SD, the fourth treatment TRMT-4 may be performed immediately after the forming/planarization of the ILD layer 161 and before the formation of the silicide layers or the contact plugs 164G and 164SD.

According to an embodiment, a method of manufacturing a semiconductor device includes: providing a substrate comprising a surface; depositing a first dielectric layer and a second dielectric layer over the substrate; forming a dummy gate electrode over the second dielectric layer; forming a gate spacer surrounding the dummy gate electrode; forming lightly-doped source/drain (LDD) regions in the substrate on two sides of the gate spacer; forming source/drain regions in the respective LDD regions; removing the dummy gate electrode to form a replacement gate; forming an inter-layer dielectric (ILD) layer over the replacement gate and the source/drain regions; and performing a treatment by introducing a trap-repairing element into at least one of the gate spacer, the second dielectric layer, the surface and the LDD regions at a time before the forming of the source/drain regions or subsequent to the formation of the ILD layer.

According to an embodiment, a method of manufacturing a semiconductor device includes: providing a substrate comprising a surface; depositing a high-k dielectric layer over the substrate; forming a dummy gate electrode over the high-k dielectric layer; forming a gate spacer surrounding the dummy gate electrode; forming lightly-doped source/drain (LDD) regions in the substrate on two sides of the gate spacer; forming source/drain regions in the respective LDD regions; forming a replacement gate and removing the dummy gate electrode; forming contact plugs to electrically couple to the replacement gate and the source/drain regions; and performing a trap-repairing operation on at least one of the high-k dielectric layer, the gate spacer, the surface and the LDD regions at a time before the formation of the dummy gate electrode or subsequent to the formation of the LDD regions.

According to an embodiment, a method of manufacturing a semiconductor device includes: providing a substrate comprising a surface; depositing a first dielectric layer and a high-k dielectric layer over the substrate; passivating the high-k dielectric layer using a nitrogen-containing plasma; forming a patterned dummy gate over the substrate subsequent to passivating the high-k dielectric layer; forming a second dielectric layer over the dummy gate and the channel region; etching a portion of the second dielectric layer contacting the channel region; forming lightly-doped source/drain (LDD) regions in the substrate on two sides of the patterned dummy gate; performing an ion implantation on the LDD regions with an element having an electronegativity greater than electronegativities of silicon and oxygen; forming source/drain regions in the respective LDD regions; performing an ion implantation on the source/drain regions; performing a first annealing operation on the ion-implanted source/drain regions at a first temperature; forming a replacement gate by etching the patterned dummy gate; forming an inter-layer dielectric layer over the source/drain regions and the replacement gate; and subsequent to the first annealing operation, performing a second annealing operation in a hydrogen ambient at a second temperature less than the first temperature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    providing a substrate comprising a surface;
    depositing a first dielectric layer and a second dielectric layer over the substrate;
    forming a dummy gate electrode over the second dielectric layer;
    forming a gate spacer surrounding the dummy gate electrode;
    forming lightly-doped source/drain (LDD) regions in the substrate on two sides of the gate spacer;
    forming source/drain regions in the respective LDD regions;
    removing the dummy gate electrode to form a replacement gate;
    forming an inter-layer dielectric (ILD) layer over the replacement gate and the source/drain regions; and
    performing a first treatment by introducing a trap-repairing element into the LDD regions before the forming of the source/drain regions,
    wherein the first treatment comprises an ion implantation with a tilted angle between about 10° and about 30°.

2. The method of claim 1, wherein the trap-repairing element comprises an electronegativity greater than an electronegativity of silicon or oxygen.

3. The method of claim 1, further comprising performing a thermal operation on the LDD regions at a temperature greater than about 900° C. subsequent to the performing of the first treatment.

4. The method of claim 1, wherein the trap-repairing element comprises a dopant type opposite to a dopant type of the LDD regions.

5. The method of claim 1, wherein forming lightly-doped source/drain (LDD) regions comprises performing a first ion implantation at a first power, and wherein introducing the trap-repairing element into the LDD regions comprises performing an second ion implantation at a second power less than the first power.

6. The method of claim 5, wherein the second power is between about 0.5 KeV and about 2 KeV.

7. The method of claim 1, wherein the first treatment comprises an ion implantation dose between about 5E14 atoms/cm$^2$ and about 1.5E15 atoms/cm$^2$.

8. The method of claim 1, wherein forming a dummy gate electrode comprises:
    depositing a gate electrode layer over the second dielectric layer; and
    patterning the gate electrode layer and the second dielectric layer into the dummy gate electrode subsequent to a second treatment.

9. The method of claim 8, wherein the second treatment comprises using a nitrogen plasma to introduce nitrogen into the second dielectric layer.

10. The method of claim 9, wherein using the nitrogen plasma to introduce nitrogen comprises introducing a nitrogen-containing gas with a flow rate between about 10 sccm and about 300 sccm.

11. The method of claim 8, wherein the first dielectric layer comprises silicon oxide and the second dielectric layer comprises a high-k dielectric material.

12. The method of claim 1, further comprising:
    performing a first annealing operation after the forming of the source/drain regions at a first temperature; and
    performing a third treatment subsequent to the first annealing operation at a second temperature less than the first temperature.

13. The method of claim 12, wherein the third treatment comprises a second annealing operation conducted in hydrogen at a pressure between about 10 atm and about 20 atm.

14. A method of manufacturing a semiconductor device, comprising:
    providing a substrate comprising a surface;
    depositing a high-k dielectric layer over the substrate;
    forming a dummy gate electrode over the high-k dielectric layer;
    forming a gate spacer to surround the dummy gate electrode;
    forming lightly-doped source/drain (LDD) regions in the substrate on two sides of the gate spacer;
    forming source/drain regions in the respective LDD regions;
    forming a replacement gate and removing the dummy gate electrode;
    forming contact plugs to electrically couple to the replacement gate and the source/drain regions;
    performing a trap-repairing operation by introducing a trap repairing element to the LDD regions subsequent to the formation of the LDD regions; and
    depositing a dielectric layer over the dummy gate electrode and the LDD regions subsequent to the introducing of the trap-repairing element to the LDD region.

15. The method of claim 14, wherein the trap-repairing element comprises a dopant type that is same as a dopant type of the LDD regions.

16. The method of claim 14, wherein the trap-repairing element comprises fluorine.

17. The method of claim 14, further comprising an annealing operation at a temperature below about 400° C., and the trap-repairing operation is performed after the formation of the replacement gate and a formation of an inter-layer dielectric (ILD) layer over the replacement gate, wherein the contact plugs are formed within the ILD layer.

18. The method of claim 14, wherein the trap-repairing element comprises an electronegativity greater than an electronegativity of silicon or oxygen.

19. The method of claim 14, wherein the trap-repairing operation is performed at an RF power between about 0.5 KeV and about 2.0 KeV.

20. A method of manufacturing a semiconductor device, comprising:
    providing a semiconductor fin comprising a channel region;
    depositing a first dielectric layer and a high-k dielectric layer over the semiconductor fin;
    forming a patterned dummy gate over the semiconductor fin subsequent to the depositing of the high-k dielectric layer;
    forming a second dielectric layer over the patterned dummy gate and the channel region;

etching a portion of the second dielectric layer contacting the channel region;

forming lightly-doped source/drain (LDD) regions in the semiconductor fin on two sides of the patterned dummy gate;

performing an ion implantation on the LDD regions with an element having an electronegativity greater than electronegativities of silicon or oxygen;

forming source/drain regions in the respective LDD regions;

performing an ion implantation on the source/drain regions;

performing a first annealing operation on the ion-implanted source/drain regions at a first temperature;

forming a replacement gate by etching the patterned dummy gate; and forming an inter-layer dielectric layer over the source/drain regions and the replacement gate.

* * * * *